(12) United States Patent
Nii

(10) Patent No.: US 7,969,811 B2
(45) Date of Patent: Jun. 28, 2011

(54) SEMICONDUCTOR MEMORY DEVICE HIGHLY INTEGRATED IN DIRECTION OF COLUMNS

(75) Inventor: Koji Nii, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 117 days.

(21) Appl. No.: 12/403,715

(22) Filed: Mar. 13, 2009

(65) Prior Publication Data
US 2009/0244950 A1    Oct. 1, 2009

(30) Foreign Application Priority Data

Mar. 27, 2008  (JP) ................................. 2008-084442

(51) Int. Cl.
*G11C 8/00*    (2006.01)
(52) U.S. Cl. .......... 365/230.06; 365/230.03; 365/230.08
(58) Field of Classification Search .............. 365/230.06, 365/222, 203, 230.08, 230.03, 230.05
See application file for complete search history.

(56) References Cited

U.S. PATENT DOCUMENTS

| | | | |
|---|---|---|---|
| 5,744,844 A | 4/1998 | Higuchi | |
| 5,930,163 A | 7/1999 | Hara et al. | |
| 6,347,062 B2 | 2/2002 | Nii et al. | |
| 6,529,401 B2 | 3/2003 | Nii | |
| 6,535,453 B2 | 3/2003 | Nii et al. | |
| 6,614,710 B2 * | 9/2003 | Song et al. | ............... 365/230.03 |
| 6,643,167 B2 | 11/2003 | Nii | |
| 2006/0291274 A1 * | 12/2006 | Uematsu | ........................ 365/154 |
| 2009/0141537 A1 * | 6/2009 | Arsovski | ........................ 365/154 |

FOREIGN PATENT DOCUMENTS

| | | |
|---|---|---|
| JP | 09-270468 | 10/1997 |
| JP | 10-178110 | 6/1998 |
| JP | 2002-043441 | 2/2002 |
| JP | 2002-237539 | 8/2002 |

OTHER PUBLICATIONS

Hiroki Noguchi et al., "A 10T Non-Precharge Two-Port SRAM for 74% Power Reduction in Video Processing," IEEE Computer Society Annual Symposium on VLSI, 2007.

* cited by examiner

*Primary Examiner* — Richard Elms
*Assistant Examiner* — Hien N Nguyen
(74) *Attorney, Agent, or Firm* — McDermott Will & Emery LLP

(57) ABSTRACT

First and second read word lines are provided in each set made of two adjacent rows. First, second, third, and fourth read bit lines are provided in each column. Each of the first and second read word lines is connected to memory cells in a corresponding one of the sets. Each of the first and third read bit lines is connected to a memory cell in one row in each of the sets, out of memory cells in a corresponding one of the columns. Each of the second and fourth read bit lines is connected to a memory cell in the other row in each of the sets, out of the memory cells in the corresponding one of the columns.

22 Claims, 16 Drawing Sheets

SEMICONDUCTOR MEMORY DEVICE HIGHLY INTEGRATED IN DIRECTION OF COLUMNS

BACKGROUND OF THE INVENTION

1. Field of the Invention

The present invention relates to a semiconductor memory device, and particularly relates to a technique of highly integrating a semiconductor memory device.

2. Description of the Background Art

Conventionally, there have been proposed layout structures of an SRAM (Static Random Access Memory) for high integration (e.g. see Japanese Patent Laying-Open No. 09-270468 and Japanese Patent Laying-Open No. 10-178110). An SRAM cell in these documents consists of six transistors, and thus due to variations among the transistors associated with miniaturization, data may be written to the memory cell at the time of readout via a bit line precharged to a high level, so that stable readout may not be performed.

In contrast, there is disclosed a 2-port SRAM cell consisting of eight transistors (e.g. see Japanese Patent Laying-Open No. 2002-237539 and Japanese Patent Laying-Open No. 2002-043441).

Although the SRAM cell in Japanese Patent Laying-Open No. 2002-237539 and Japanese Patent Laying-Open No. 2002-043441 is highly integrated to a certain degree, a sufficient level of integration has not yet been reached. The SRAM is not highly integrated particularly in a direction of the columns, so that the length of bit lines is still large, and that data readout from the memory cell and data write to the memory cell are performed at a low speed and require high power. Further, the SRAM cell consisting of eight transistors described in Japanese Patent Laying-Open No. 2002-237539 and Japanese Patent Laying-Open No. 2002-043441 has not yet achieved sufficient stability of the readout.

SUMMARY OF THE INVENTION

An object of the present invention is to provide a semiconductor memory device enabling stable readout and highly integrated in a direction of the columns.

According to a semiconductor memory device in an embodiment of the present invention, the semiconductor memory device includes: a memory cell array having a plurality of memory cells arranged in rows and columns; first and second read word lines provided in each of sets each made of two adjacent ones of the rows; and first, second, third, and fourth read bit lines provided in each of the columns. Each of the first and second read word lines is connected to memory cells in a corresponding one of the sets. Each of the first and third read bit lines is connected to one of memory cells in one row in each of the sets, out of memory cells in a corresponding one of the columns, and each of the second and fourth read bit lines is connected to one of memory cells in the other row in each of the sets, out of the memory cells in the corresponding one of the columns.

The semiconductor memory device according to the present invention enables stable readout and high integration in a direction of the columns.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments according to the present invention will hereinafter be described with reference to the drawings.

First Embodiment

An embodiment of the present invention relates to a semiconductor memory device of a type including 10 transistors, provided with one write port and two read ports, and precharging a pair of bit lines prior to data readout from a memory cell.

Figure 1:
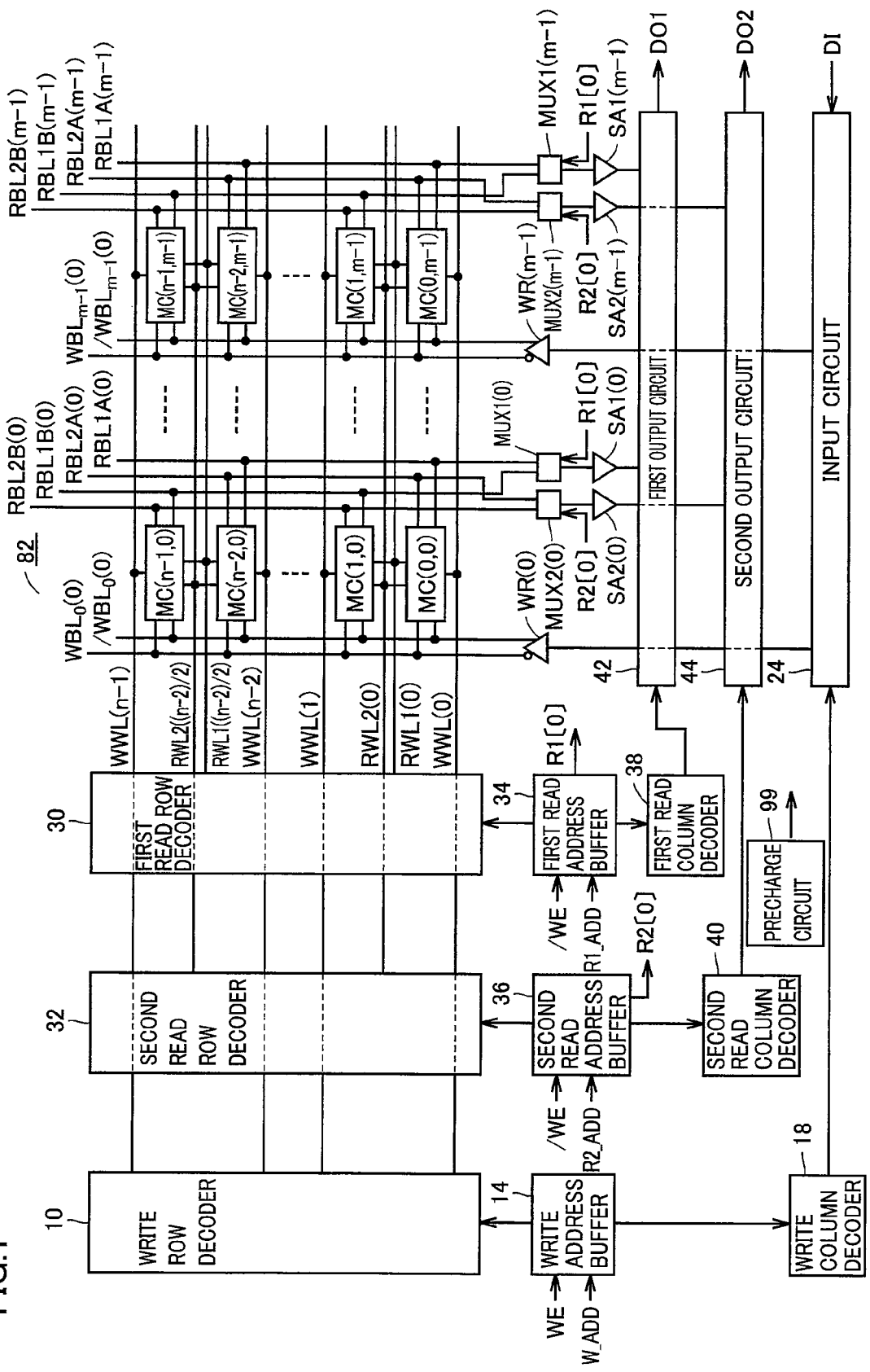
FIG. 1 is a block diagram that represents a schematic configuration of a semiconductor memory device according to a first embodiment.

FIG. 1 is a block diagram that represents a schematic configuration of a semiconductor memory device according to a first embodiment.

With reference to FIG. 1, the semiconductor memory device includes a write address buffer 14, a first read address buffer 34, a second read address buffer 36, a write row decoder 10, a first read row decoder 30, a second read row decoder 32, a write column decoder 18, a first read column decoder 38, a second read column decoder 40, an input circuit 24, a first output circuit 42, a second output circuit 44, a memory cell array 82, and a precharge circuit 99.

Memory cell array 82 has a plurality of SRAM cells arranged in rows and columns. Given that the number of rows is n and the number of columns is m, that a row closest to and a row farthest from a write driver WR and a sense amplifier SA are provided with reference numbers 0 and (n−1), respectively, and that a column closest to and a column farthest from first read row decoder 30 are provided with reference numbers 0 and (m−1), respectively, an SRAM cell located in the i-th row and the j-th column is denoted as MC (i, j). Here, two adjacent rows are made into a set. Specifically, two rows having reference numbers 0 and 1 are denoted as the 0th set, two rows having reference numbers 2 and 3 are denoted as the 1st set, and two rows having reference numbers (n−2) and (n−1) are denoted as the ((n−2)/2)-st set.

For the j-th column, there is provided a pair of write bit lines WBL (j), /WBL (j) of a positive phase and a negative phase. Memory cells MC (*, j) in the j-th column are connected to the pair of write bit lines WBL (j), /WBL (j) of a positive phase and a negative phase (* is 0 to (n−1)).

For the j-th column, there are provided a first read bit line RBL1A (j), a second read bit line RBL1B (j), a third read bit line RBL2A (j), and a fourth read bit line RBL2B (j). Memory cells MC (e, j) in even-numbered rows and the j-th column are connected to first read bit line RBL1A (j) and third read bit line RBL2A (j) (e is an even number). Memory cells MC (o, j) in odd-numbered rows and the j-th column are connected to second read bit line RBL1B (j) and fourth read bit line RBL2B (j) (o is an odd number).

For the i-th row, a write word line WWL (i) is provided. Memory cells MC (i, *) in the i-th row are connected to write word line WWL (i) (* is 0 to (m−1)).

For the i-th set, there are provided a first read word line RWL1 (i) and a second read word line RWL2 (i). Memory cells MC (2×i, *), MC (2×i+1, *) in the i-th set are connected to first read word line RWL1 (i) and second read word line RWL2 (i) (* is 0 to (m−1)).

When a write enable signal WE of a positive phase is asserted, write address buffer 14 outputs a row-specifying portion of a write address W_ADD inputted from an outside to write row decoder 10, and outputs a column-specifying portion of write address W_ADD to write column decoder 18.

When a write enable signal /WE of a negative phase is asserted, first read address buffer 34 outputs a row-address-set-specifying portion of a first read address R1_ADD inputted from an outside (bits of the row address except for the least significant bit) to first read row decoder 30, outputs a portion that specifies a row in the row address set, of first read address R1_ADD (the least significant bit R1 [0] in the row address) to a first selector MUX1, and outputs a column-specifying portion of first read address R1_ADD to first read column decoder 38.

When write enable signal /WE of a negative phase is asserted, second read address buffer 36 outputs a row-address-set-specifying portion of a second read address R2_ADD inputted from an outside (bits of the row address except for the least significant bit) to second read row decoder 32, outputs a portion that specifies a row in the row address set, of second read address R2_ADD (the least significant bit R2 [0] in the row address) to a second selector MUX2, and outputs a column-specifying portion of second read address R2_ADD to second read column decoder 40.

Write row decoder 10 activates any one of write word lines WWL (i) (i=0 to (n−1)) in accordance with the row address in write address W_ADD transmitted from write address buffer 14.

First read row decoder 30 activates any one of first read word lines RWL1 (i) (i=0 to (n−2)/2) in accordance with the row-address-set-specifying address in first read address R1_ADD transmitted from first read address buffer 34.

Second read row decoder 32 activates any one of second read word lines RWL2 (i) (i=0 to (n−2)/2) in accordance with the row-address-set-specifying address in second read address R2_ADD transmitted from second read address buffer 36.

Write column decoder 18 selects a column in accordance with the column address in write address W_ADD transmitted from write address buffer 14, and causes input circuit 24 to select write driver WR in the selected column.

First read column decoder 38 selects a column in accordance with the column address in first read address R1_ADD transmitted from first read address buffer 34, and causes first output circuit 42 to select an output signal of a first sense amplifier SA1 in the selected column.

Second read column decoder 40 selects a column in accordance with the column address in second read address R2_ADD transmitted from second read address buffer 36, and causes second output circuit 44 to select an output signal of a second sense amplifier SA2 in the selected column.

For the j-th column, there is provided a first selector MUX1 (j) to which first read bit line RBL1A (j) and second read bit line RBL1B (j) are connected. First selector MUX1 (j) selects any one of first read bit line RBL1A (j) and second read bit line RBL1B (j), which are connected thereto, in accordance with an address R1 [0] that specifies a row in the row address set in first read address R1_ADD transmitted from first read address buffer 34, and outputs a signal of the selected bit line to first sense amplifier SA1 (j). For the j-th column, there is also provided a second selector MUX2 (j) to which third read bit line RBL2A (j) and fourth read bit line RBL2B (j) are connected. Second selector MUX2 (j) selects any one of third read bit line RBL2A (j) and fourth read bit line RBL2B (j), which are connected thereto, in accordance with an address R2 [0] that specifies a row in the row address set in second read address R2_ADD transmitted from second read address buffer 36, and outputs a signal of the selected bit line to second sense amplifier SA2 (j).

For the j-th column, first sense amplifier SA1 (j) is provided. First sense amplifier SA1 (j) amplifies the data transmitted from first selector MUX1 (j), and transmits the amplified data to first output circuit 42. For the j-th column, second sense amplifier SA2 (j) is also provided. Second sense amplifier SA2 (j) amplifies the data transmitted from second selector MUX2 (j), and transmits the amplified data to second output circuit 44.

For the j-th column, a write driver WR (j) is provided. Write driver WR (j) receives write data from input circuit 24, outputs data at a high or low level corresponding to the write data to write bit line WBL (j) of a positive phase, which is connected to write driver WR (j), and outputs reverse data at a high or low level corresponding to the write data to write bit line /WBL (j) of a negative phase, which is connected to write driver WR (j).

Input circuit 24 outputs write data DI inputted from an outside to write driver WR in the column specified by write column decoder 18.

First output circuit 42 receives data from first sense amplifiers SA1 in m columns, selects data from first sense amplifier SA1 in the column specified by first read column decoder 38, and outputs the selected data to an outside as first read data DO1.

Second output circuit 44 receives data from second sense amplifiers SA2 in m columns, selects data from second sense amplifier SA2 in the column specified by second read column decoder 40, and outputs the selected data to an outside as second read data DO2.

Prior to data readout from memory cell MC, precharge circuit 99 precharges all of first read bit lines RBL1A (j), second read bit lines RBL1B (j), third read bit lines RBL2A (j), and fourth read bit lines RBL2B (j) (all of j=0 to (m−1)) to a high level.

(Configuration of a Memory Cell)

Figure 2:
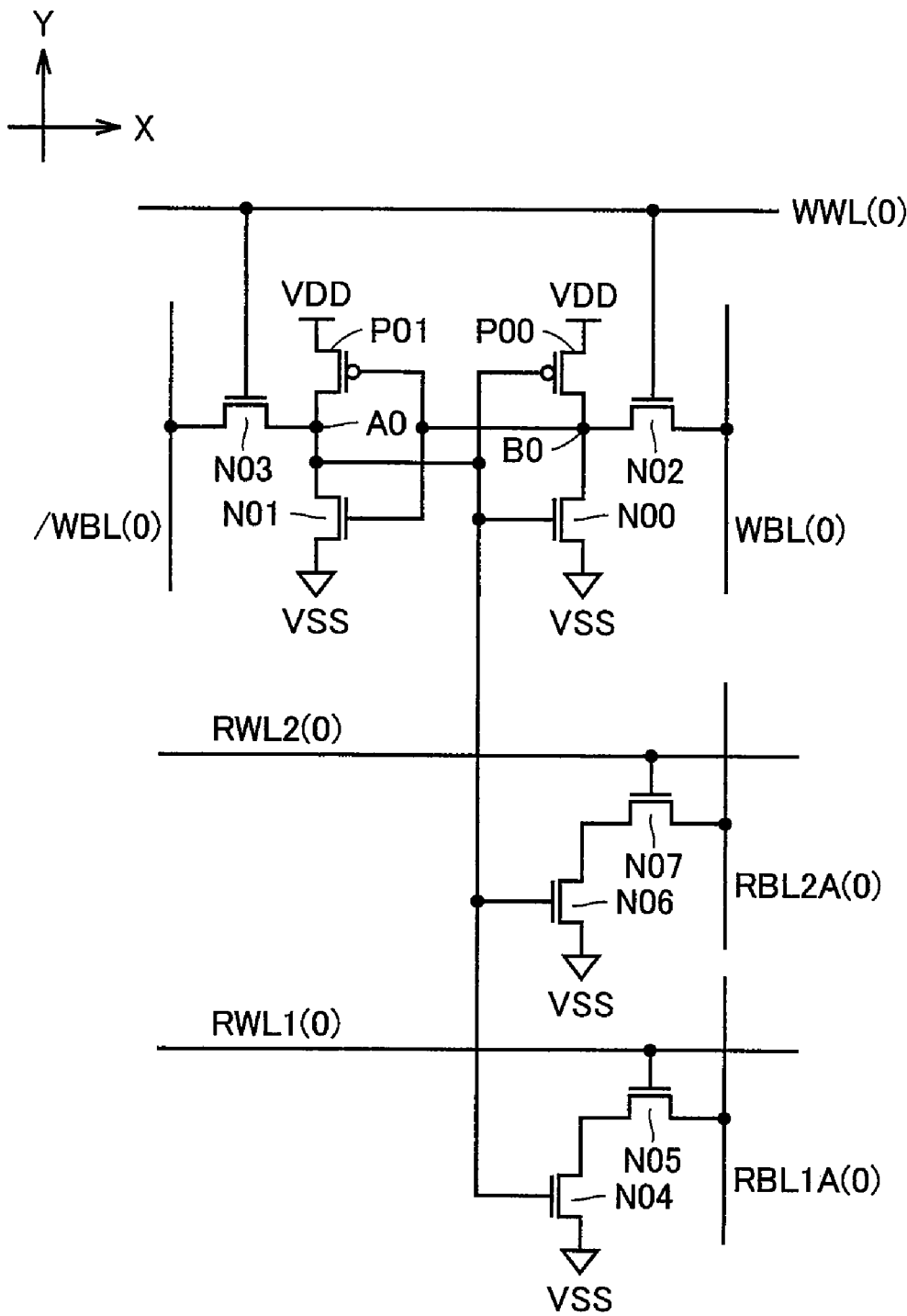
FIG. 2 is a circuit diagram that shows a configuration of a memory cell MC (0, 0) in FIG. 1.

FIG. 2 is a circuit diagram that shows a configuration of memory cell MC (0, 0) in FIG. 1.

With reference to FIG. 2, memory cell MC (0, 0) includes P-channel MOS transistors P00, P01, and N-channel MOS transistors N00, N01, N02, N03, N04, N05, N06, N07.

Memory cell MC (0, 0) is connected to a write word line WWL (0), a first read word line RWL1 (0), and a second read word line RWL2 (0) that extend along a direction of the rows. Further, memory cell MC (0, 0) is connected to a pair of write bit lines WBL (0), /WBL (0), a first read bit line RBL1A (0), and a third read bit line RBL2A (0) that extend along a direction of the columns.

P-channel MOS transistor P00 is connected between a power supply node VDD and a storage node B0, and has its gate connected to a storage node A0. N-channel MOS transistor N00 is connected between storage node B0 and a ground node VSS, and has its gate connected to storage node A0. P-channel MOS transistor P00 and N-channel MOS transistor N00 configure a first CMOS inverter.

P-channel MOS transistor P01 is connected between power supply node VDD and storage node A0, and has its gate connected to storage node B0. N-channel MOS transistor N01 is connected between storage node A0 and ground node VSS, and has its gate connected to storage node B0. P-channel MOS transistor P01 and N-channel MOS transistor N01 configure a second CMOS inverter.

Storage node B0 identified as an input of the first CMOS inverter is connected to an output of the second CMOS inverter. Storage node A0 identified as an input of the second CMOS inverter is connected to an output of the first CMOS inverter.

N-channel MOS transistor N02 is connected between storage node B0 and write bit line WBL (0) of a positive phase, and has a gate to which write word line WWL (0) is connected. N-channel MOS transistor N03 is connected between storage node A0 and write bit line /WBL (0) of a negative phase, and has a gate to which write word line WWL (0) is connected.

N-channel MOS transistors N04, N05 are connected in series between ground node VSS and first read bit line RBL1A (0), and have gates to which storage node A0 and first read word line RWL1 (0) are connected, respectively. N-channel MOS transistors N06, N07 are connected in series between ground node VSS and third read bit line RBL2A (0), and have gates to which storage node A0 and second read word line RWL2 (0) are connected, respectively.

When first read word line RWL1 (0) is activated to a high level, N-channel MOS transistor N05 is turned on. When storage node A0 is at a high level, N-channel MOS transistor N05 is in an on state, and a ground potential (a potential at a low level) is transmitted to first read bit line RBL1A (0). In contrast, when storage node A0 is at a low level, N-channel MOS transistor N05 is in an off state, and first read bit line RBL1A (0) maintains a precharged high level. The data stored in memory cell MC (0, 0) is thereby read out to first read bit line RBL1A (0).

Similarly, when second read word line RWL2 (0) is activated to a high level, N-channel MOS transistor N07 is turned on. When storage node A0 is at a high level, N-channel MOS transistor N07 is in an on state, and a ground potential (a potential at a low level) is transmitted to third read bit line RBL2A (0). In contrast, when storage node A0 is at a low level, N-channel MOS transistor N07 is in an off state, and third read bit line RBL2A (0) maintains a precharged high level. The data stored in memory cell MC (0, 0) is thereby read out to third read bit line RBL2A (0).

Other memory cells in FIG. 1 have the same internal circuit configuration, except that corresponding first read word line, second read word line, write word line, pair of write bit lines, first read bit line, second read bit line, third read bit line, and fourth read bit line are connected thereto, and thus the description thereof will not be repeated.

(Exemplary Packaging of Memory Cells: Lower Layer)

Figure 3:
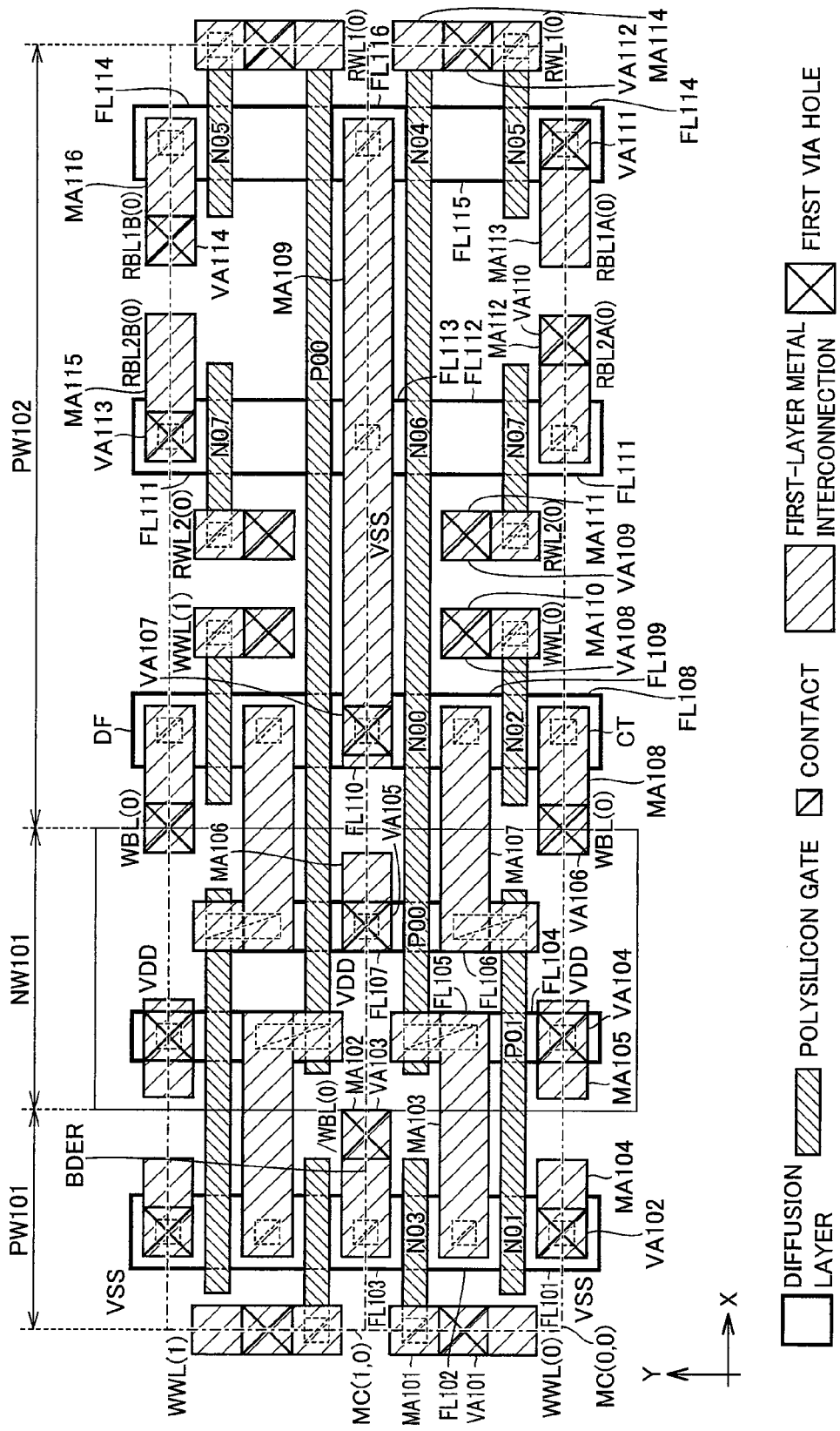
FIG. 3 is a plan view that shows an arrangement of a lower layer including a well, a diffusion region, a polysilicon, a contact hole, a first-layer metal interconnection, and a first via hole of a memory cell array in the first embodiment.

FIG. 3 is a plan view that shows an arrangement of a lower layer including a well, a diffusion region, a polysilicon, a contact hole, a first-layer metal interconnection, and a first via hole of the memory cell array in the first embodiment.

As shown in FIG. 3, memory cells for two bits, namely, a memory cell MC (0, 0) and a memory cell MC (1, 0) adjacent thereto in the Y direction (the direction of the columns) are presented. In FIG. 3, reference characters are attached only to one contact hole CT, polycrystalline silicon (polysilicon) PO, and diffusion region DF as representative examples.

In memory cells MC (0, 0) and MC (1, 0), an N-well NW101 is formed at a central portion in the X direction, and a P-channel MOS transistor is formed therein. P-wells PW101, PW102 are arranged on opposite sides of N-well NW101, and an N-channel MOS transistor is formed in each of P-wells PW101, PW102. Here, each of wells NW101, PW101, PW102 continues to the wells of all the other memory cells in the same column. In other words, each of wells NW101, PW101, PW102 extends in the Y-axis direction similarly as in the case of bit lines.

More specifically, one N-well NW101 and two P-wells PW101, PW102, which are located on opposite sides of N-well NW10, respectively, are formed in memory cells MC (0, 0), MC (1, 0) at a surface of a semiconductor substrate. Further, memory cell MC (0, 0) and memory cell MC (1, 0) are arranged approximately symmetrically with respect to a memory cell boundary BDER.

(As to Memory Cell MC (0, 0))

Description will hereinafter be made on an arrangement in memory cell MC (0, 0).

P-channel MOS transistors P00, P01 are formed in N-well NW101. N-channel MOS transistors N01, N03 are formed in P-well PW101, and N-channel MOS transistors N00, N02, N04, N05, N06, N07 are arranged in P-well PW102.

P-channel MOS transistor P00 has a source and a drain formed of a pair of P-type diffusion regions FL106, FL107, and a gate formed of polysilicon arranged therebetween. P-type diffusion region FL107 is electrically connected to an upper layer via contact hole CT, a first-layer metal interconnection MA106, and a first via hole VA105, and is electrically connected to a power supply line VDD in the upper layer. P-type diffusion region FL106 is electrically connected to an N-type diffusion region FL109 via contact hole CT, a first-layer metal interconnection MA107, and contact hole CT. Further, the gate of P-channel MOS transistor P00 is formed of polysilicon PO, which is common to the gates of N-channel MOS transistors N00, N06, N04. Polysilicon PO is electrically connected to a P-type diffusion region FL105 via contact hole CT, and furthermore, electrically connected to an N-type diffusion region FL102 via a first-layer metal interconnection MA103 and contact hole CT.

P-channel MOS transistor P01 has a source and a drain made of a pair of P-type diffusion regions FL104, FL105, and a gate formed of polysilicon arranged therebetween. P-type diffusion region FL104 is electrically connected to the upper layer via contact hole CT, a first-layer metal interconnection MA105, and a first via hole VA104, and is electrically connected to power supply line VDD in the upper layer. P-type diffusion region FL105 is electrically connected to an N-type diffusion region FL102 via contact hole CT, a first-layer metal interconnection MA103, and contact hole CT. The gate of P-channel MOS transistor P01 is formed of polysilicon PO, which is common to the gate of N-channel MOS transistor N01. Polysilicon PO is electrically connected to an N-type diffusion region FL109 via contact hole CT, a first-layer metal interconnection MA107, and contact hole CT.

N-channel MOS transistor N00 has a source and a drain made of a pair of N-type diffusion regions FL109, FL110, and a gate formed of polysilicon arranged therebetween. N-type diffusion region FL110 is electrically connected to the upper layer via contact hole CT, a first-layer metal interconnection MA109, and a first via hole VA107, and is electrically connected to ground line VSS in the upper layer.

N-channel MOS transistor N01 has a source and a drain made of a pair of N-type diffusion regions FL101, FL102, and a gate formed of polysilicon arranged therebetween. N-type diffusion region FL101 is electrically connected to the upper layer via contact hole CT, a first-layer metal interconnection MA104, and a first via hole VA102, and is electrically connected to ground line VSS in the upper layer.

N-channel MOS transistor N02 has a source and a drain made of a pair of N-type diffusion regions FL108, FL109, and a gate formed of polysilicon arranged therebetween. N-type diffusion region FL108 is electrically connected to the upper layer via contact hole CT, a first-layer metal interconnection MA108, and a first via hole V106, and is electrically connected to write bit line WBL (0) in the upper layer.

N-channel MOS transistor N03 has a source and a drain made of a pair of N-type diffusion regions FL102, FL103, and a gate formed of polysilicon arranged therebetween. N-type diffusion region FL103 is electrically connected to the upper layer via contact hole CT, a first-layer metal interconnection MA102, and a first via hole VA103, and is electrically connected to write bit line /WBL (0) in the upper layer. Further, the polysilicon forming the gate of N-channel MOS transistor N03 is electrically connected to the upper layer via contact hole CT, a first-layer metal interconnection MA110, and a first via hole VA101, and is electrically connected to write word line WWL (0) in the upper layer.

N-channel MOS transistor N04 has a source and a drain made of a pair of N-type diffusion regions FL115, FL116, and a gate formed of polysilicon arranged therebetween. N-type diffusion region FL116 is electrically connected to the upper layer via contact hole CT, first-layer metal interconnection MA109, and first via hole VA107, and is electrically connected to ground line VSS in the upper layer.

N-channel MOS transistor N05 has a source and a drain made of a pair of N-type diffusion regions FL114, FL115, and a gate formed of polysilicon arranged therebetween. N-type diffusion region FL114 is electrically connected to the upper layer via contact hole CT, a first-layer metal interconnection MA113, and a first via hole VA 111, and is electrically connected to first read bit line RBL1A (0) in the upper layer. The gate of N-channel MOS transistor N05 is electrically connected to the upper layer via contact hole CT, a first-layer metal interconnection MA114, and a first via hole VA112, and is electrically connected to first read word line RWL1 (0) in the upper layer.

N-channel MOS transistor N06 has a source and a drain made of a pair of N-type diffusion regions FL112, FL113, and a gate formed of polysilicon arranged therebetween. N-type diffusion region FL113 is electrically connected to the upper layer via contact hole CT, first-layer metal interconnection MA109, and first via hole VA107, and is electrically connected to ground line VSS in the upper layer.

N-channel MOS transistor N07 has a source and a drain made of a pair of N-type diffusion regions FL111, FL112, and a gate formed of polysilicon arranged therebetween. N-type diffusion region FL111 is electrically connected to the upper layer via contact hole CT, a first-layer metal interconnection MA112, and a first via hole VA110, and is electrically connected to third read bit line RBL2A (0) in the upper layer. The gate of N-channel MOS transistor N07 is electrically connected to the upper layer via contact hole CT, a first-layer metal interconnection MA 111, and a first via hole VA109, and is electrically connected to second read word line RWL2 (0) in the upper layer.

(As to Memory Cell MC (1, 0))

Memory cell MC (1, 0) and memory cell MC (0, 0) are basically arranged symmetrically with respect to memory cell boundary BDER. However, memory cell MC (1, 0) differs from memory cell MC (0, 0) on the following points because memory cell MC (0, 0) is connected to first read bit line RBL1A (0) and third read bit line RBL2A (0), whereas memory cell MC (1, 0) is connected to second read bit line RBL1B (0) and fourth read bit line RBL2B (0).

N-type diffusion region FL114 that forms N-channel MOS transistor N05 is electrically connected to the upper layer via contact hole CT, a first-layer metal interconnection MA116, and a first via hole VA114, and is electrically connected to second read bit line RBL1B (0) in the upper layer. First-layer metal interconnection MA116 has no first via hole for electrically connecting to first read bit line RBL1A (0).

N-type diffusion region FL111 forming N-channel MOS transistor N07 is electrically connected to the upper layer via contact hole CT, a first-layer metal interconnection MA115, and a first via hole VA113, and is electrically connected to fourth read bit line RBL2B (0) in the upper layer. First-layer metal interconnection MA115 has no first via hole for electrically connecting to first read bit line RBL1A (0).

In FIG. 3, the diffusion region, the contact hole, the first-layer metal interconnection, and the first via hole arranged to be astride memory cell boundary BDER are shared by memory cell MC (0, 0) and memory cell MC (1, 0).

(Exemplary Packaging of Memory Cells: Upper Layer)

Figure 4:
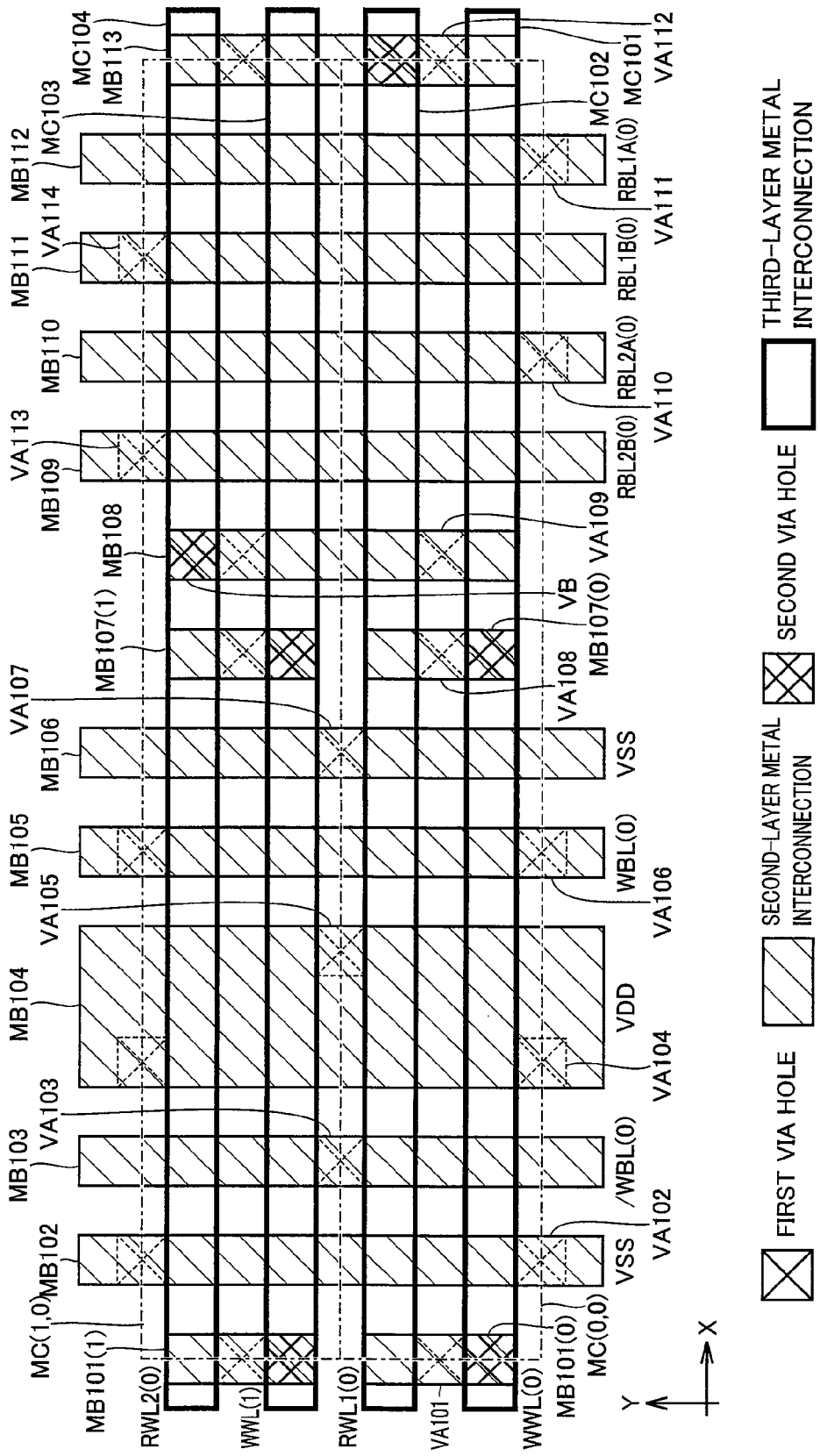
FIG. 4 is a plan view that shows an arrangement of an upper layer including a first via hole, a second-layer metal interconnection, a second via hole, and a third-layer metal interconnection in the first embodiment.

FIG. 4 is a plan view that shows an arrangement of the upper layer including a first via hole, a second-layer metal interconnection, a second via hole, and a third-layer metal interconnection in the first embodiment.

As shown in FIG. 4, memory cells for two bits, namely, memory cell MC (0, 0) and memory cell MC (1, 0) adjacent thereto in the Y direction are presented. In FIG. 4, a reference character is attached only to a second via hole VB located at a representative position.

In memory cells MC (0, 0) and MC (1, 0), the second-layer metal interconnections are arranged in the Y-axis direction, and the third-layer metal interconnections are arranged in the X-axis direction. The second-layer metal interconnections and the first-layer metal interconnections located in the underlayer as shown in FIG. 3 are electrically connected via first via holes VA. The second-layer metal interconnections and the third-layer metal interconnections located in the upper layer are connected via second via holes VB. Some of the second-layer metal interconnections continue to all the other memory cells in the same column and extend in the Y-axis direction, and other of the second-layer metal interconnections exist only in a single memory cell or in two memory cells adjacent in the Y direction, and are separated from the second-layer metal interconnection in other memory cells in the same column. The third-layer metal interconnections continue to all the other memory cells in the same row and extend in the X-axis direction.

Second-layer metal interconnections MB101 (0 and 1), MB102, MB103, MB104, MB105, MB106, MB107 (0 and 1), MB108, MB109, MB110, MB111, MB112 are arranged in this order toward the positive direction of the X-axis.

Further, in memory cell MC (0, 0), third-layer metal interconnections MC 101, MC102 are arranged in this order from the bottom in the Y-axis direction, and in memory cell MC (1, 0), third-layer metal interconnections MC 103, MC 104 are arranged in this order toward the positive direction of the Y-axis.

Third-layer metal interconnection MC 101 is write word line WWL (0) extending in the X-axis direction. Third-layer metal interconnection MC102 is first read word line RWL1 (0) extending in the X-axis direction. Third-layer metal interconnection MC103 is write word line WWL (1) extending in the X-axis direction. Third-layer metal interconnection MC104 is second read word line RWL2 (0) extending in the X-axis direction.

Second-layer metal interconnection MB102 is ground line VSS extending in the Y-axis direction. In memory cell MC (0, 0), second-layer metal interconnection MB102 is electrically connected to the lower layer via first via hole VA102, and is electrically connected to first-layer metal interconnection MA104 in FIG. 3 in the lower layer. In memory cell MC (1, 0) as well, second-layer metal interconnection MB102 is electrically connected to the lower layer via a first via hole located symmetrically to first via hole VA102 with respect to memory cell boundary BDER. Ground line VSS is thereby electrically connected to diffusion region FL101 that configures N-channel MOS transistor N01.

Second-layer metal interconnection MB103 is write bit line /WBL (0) extending in the Y-axis direction. Second-layer metal interconnection MB103 is electrically connected to the lower layer via first via hole VA103 arranged to be astride memory cell boundary BDER, and is electrically connected to first-layer metal interconnection MA102 in FIG. 3 in the lower layer. Write bit line /WBL (0) is thereby electrically connected to diffusion region FL103 that configures N-channel MOS transistor N03.

Second-layer metal interconnection MB104 is power supply line VDD extending in the Y-axis direction. In memory cell MC (0, 0), second-layer metal interconnection MB104 is electrically connected to the lower layer via first via hole VA104, and is electrically connected to first-layer metal interconnection MA105 in FIG. 3 in the lower layer. In memory cell MC (1, 0) as well, second-layer metal interconnection MB104 is electrically connected to the lower layer via a first via hole located symmetrically to first via hole VA104 with respect to memory cell boundary BDER. Further, second-layer metal interconnection MB104 is electrically connected to the lower layer via first via hole VA105 arranged to be astride memory cell boundary BDER, and is electrically connected to first-layer metal interconnection MA 106 in FIG. 3 in the lower layer. Power supply line VDD is thereby connected to diffusion region FL104 that configures P-channel MOS transistor P01 and diffusion region FL107 that configures P-channel MOS transistor P00.

Second-layer metal interconnection MB105 is write bit line WBL (0) extending in the Y-axis direction. In memory cell MC (0, 0), second-layer metal interconnection MB105 is electrically connected to the lower layer via first via hole VA106, and is electrically connected to first-layer metal interconnection MA 108 in FIG. 3 in the lower layer. Further, in memory cell MC (1, 0) as well, second-layer metal interconnection MB105 is electrically connected to the lower layer via a first via hole located symmetrically to first via hole VA106 with respect to memory cell boundary BDER. Write bit line WBL (0) is thereby electrically connected to diffusion region FL108 that configures N-channel MOS transistor N02.

Second-layer metal interconnection MB106 is ground line VSS extending in the Y-axis direction. Second-layer metal interconnection MB106 is electrically connected to the lower layer via first via hole VA107 arranged to be astride memory cell boundary BDER, and is electrically connected to first-layer metal interconnection MA109 in FIG. 3 in the lower layer. Ground line VSS is thereby electrically connected to diffusion region FL110 that configures N-channel MOS transistor N00.

Second-layer metal interconnection MB109 is fourth read bit line RBL2B (0) extending in the Y-axis direction. In memory cell MC (1, 0), second-layer metal interconnection MB109 is electrically connected to the lower layer via first via hole VA113, and is electrically connected to first-layer metal interconnection MA115 in FIG. 3 in the lower layer. Fourth read bit line RBL2B (0) is thereby electrically connected to diffusion region FL111 that configures N-channel MOS transistor N07 in memory cell MC (1, 0).

Second-layer metal interconnection MB110 is third read bit line RBL2A (0) extending in the Y-axis direction. In memory cell MC (0, 0), second-layer metal interconnection MB110 is electrically connected to the lower layer via first via hole VA 110, and is electrically connected to first-layer metal interconnection MA112 in FIG. 3 in the lower layer. Third read bit line RBL2A (0) is thereby electrically connected to diffusion region FL111 that configures N-channel MOS transistor N07 in memory cell MC (0, 0).

Second-layer metal interconnection MB111 is second read bit line RBL1B (0) extending in the Y-axis direction. In memory cell MC (1, 0), second-layer metal interconnection MB 111 is electrically connected to the lower layer via first via hole VA114, and is electrically connected to first-layer metal interconnection MA116 in FIG. 3 in the lower layer. Second read bit line RBL1B (0) is thereby electrically connected to diffusion region FL114 that configures N-channel MOS transistor N05 in memory cell MC (1, 0).

Second-layer metal interconnection MB112 is first read bit line RBL1A (0) extending in the Y-axis direction. In memory cell MC (0, 0), second-layer metal interconnection MB112 is electrically connected to the lower layer via first via hole VA 111, and is electrically connected to first-layer metal interconnection MA 113 in FIG. 3 in the lower layer. First read bit line RBL1A (0) is thereby electrically connected to diffusion region FL114 that configures N-channel MOS transistor N05 in memory cell MC (0, 0).

Second-layer metal interconnection MB101 (0) exists only in memory cell MC (0, 0). Second-layer metal interconnection MB101 (0) is electrically connected to the lower layer via first via hole VA 101, and is electrically connected to first-layer metal interconnection MA101 in FIG. 3 in the lower layer. Further, second-layer metal interconnection MB101 (0) is electrically connected to third-layer metal interconnection MC101, which is identified as write word line WWL (0), via second via hole VB. Second-layer metal interconnection MB101 (0) electrically connects write word line WWL (0) and a polysilicon gate of N-channel MOS transistor N03. Second-layer metal interconnection MB101 (1) exists only in memory cell MC (1, 0), and has a function similar to the function of second-layer metal interconnection MB101 (0).

Second-layer metal interconnection MB107 (0) exists only in memory cell MC (0, 0). Second-layer metal interconnection MB107 (0) is electrically connected to the lower layer via first via hole VA108, and is electrically connected to first-layer metal interconnection MA110 in FIG. 3 in the lower layer. Further, second-layer metal interconnection MB107 (0) is electrically connected to third-layer metal interconnection MC101, which is identified as write word line WWL (0), via second via hole VB. Second-layer metal interconnection MB107 (0) electrically connects write word line WWL (0) and a polysilicon of N-channel MOS transistor N02. Second-layer metal interconnection MB107 (1) exists only in memory cell MC (1, 0), and has a function similar to the function of second-layer metal interconnection MB107 (0).

Second-layer metal interconnection MB108 exists only in memory cell MC (0, 0) and memory cell MC (1, 0) adjacent thereto in the Y direction. In memory cell MC (0, 0), second-layer metal interconnection MB108 is electrically connected to the lower layer via first via hole VA109, and is electrically connected to first-layer metal interconnection MA111 in FIG. 3 in the lower layer. Further, in memory cell MC (1, 0) as well, second-layer metal interconnection MB108 is electrically connected to the lower layer via a first via hole located symmetrically to first via hole VA109 with respect to memory cell boundary BDER. Further, second-layer metal interconnection MB108 is electrically connected to third-layer metal interconnection MC104, which is identified as second read word line RWL2 (0), via second via hole VB in memory cell MC (1, 0). Second-layer metal interconnection MB108 causes the polysilicon gates of N-channel MOS transistors N07 in memory cell MC (0, 0) and memory cell MC (1, 0) to be electrically connected to second read word line RWL2 (0) in a common manner.

A second-layer metal interconnection MB113 exists only in memory cell MC (0, 0) and memory cell MC (1, 0) adjacent thereto in the Y direction. In memory cell MC (0, 0), second-layer metal interconnection MB113 is electrically connected to the lower layer via first via hole VA112, and is electrically connected to first-layer metal interconnection MA114 in FIG. 3 in the lower layer. Further, in memory cell MC (1, 0) as well, second-layer metal interconnection MB113 is electrically connected to the lower layer via a first via hole located symmetrically to first via hole VA112 with respect to memory cell boundary BDER. Further, second-layer metal interconnection MB113 is electrically connected to third-layer metal interconnection MC102, which is identified as first read word line RWL1 (0), via second via hole VB in memory cell MC (0, 0). Second-layer metal interconnection MB113 causes the polysilicon gates of N-channel MOS transistors N05 in memory cell MC (0, 0) and memory cell MC (1, 0) to be electrically connected to first read word line RWL1 (0) in a common manner.

(Characteristics of the Layout of Memory Cells in the Embodiment of the Present Invention)

Description will hereinafter be made on characteristics of the layout of memory cells in the embodiment of the present invention.

(1) The layout of memory cells becomes longer in a horizontal direction, so that the length of the bit lines can be reduced. Therefore, data readout from the memory cells and data write to the memory cells can be performed at a high speed and with low power.

(2) The gates of all of the transistors in the memory cells are oriented in the same direction, and transistors N03, P00, N00, N06, N04 are aligned and transistors N01, P01, N02, N07, N05 are aligned. Therefore, lithography becomes easy and manufacturing variations can be prevented.

(3) The memory cells adjacent to each other in the column direction share first read word line RWL1 and second read word line RWL2. Moreover, in the memory cells adjacent to each other in the column direction, the memory cells in an even-numbered row are connected to first read bit line RBL1A and third read bit line RBL2A, and the memory cells in an odd-numbered row are connected to second read bit line RBL1B and fourth read bit line RBL2B. The number of interconnections extending in the word line direction (the X-axis direction, the direction of the rows) can thereby be reduced, and the length in the bit line direction (the Y-axis direction, the direction of the columns) can be reduced. Further, if the length in the bit line direction is set to be constant, the pitch of the interconnections can be increased, which makes it possible to reduce a coupling noise between the word lines.

(4) Between write bit line WBL or /WBL and read bit line RBL1A, RBL1B, RBL2A, or RBL2B, ground line VSS is placed in the same interconnection layer, so that a shield is formed therebetween and a coupling noise can be reduced.

Second Embodiment

An embodiment of the present invention relates to a semiconductor memory device of a type including 10 transistors, provided with one write port and one read port, and not precharging a pair of bit lines prior to data readout from a memory cell.

Figure 5:
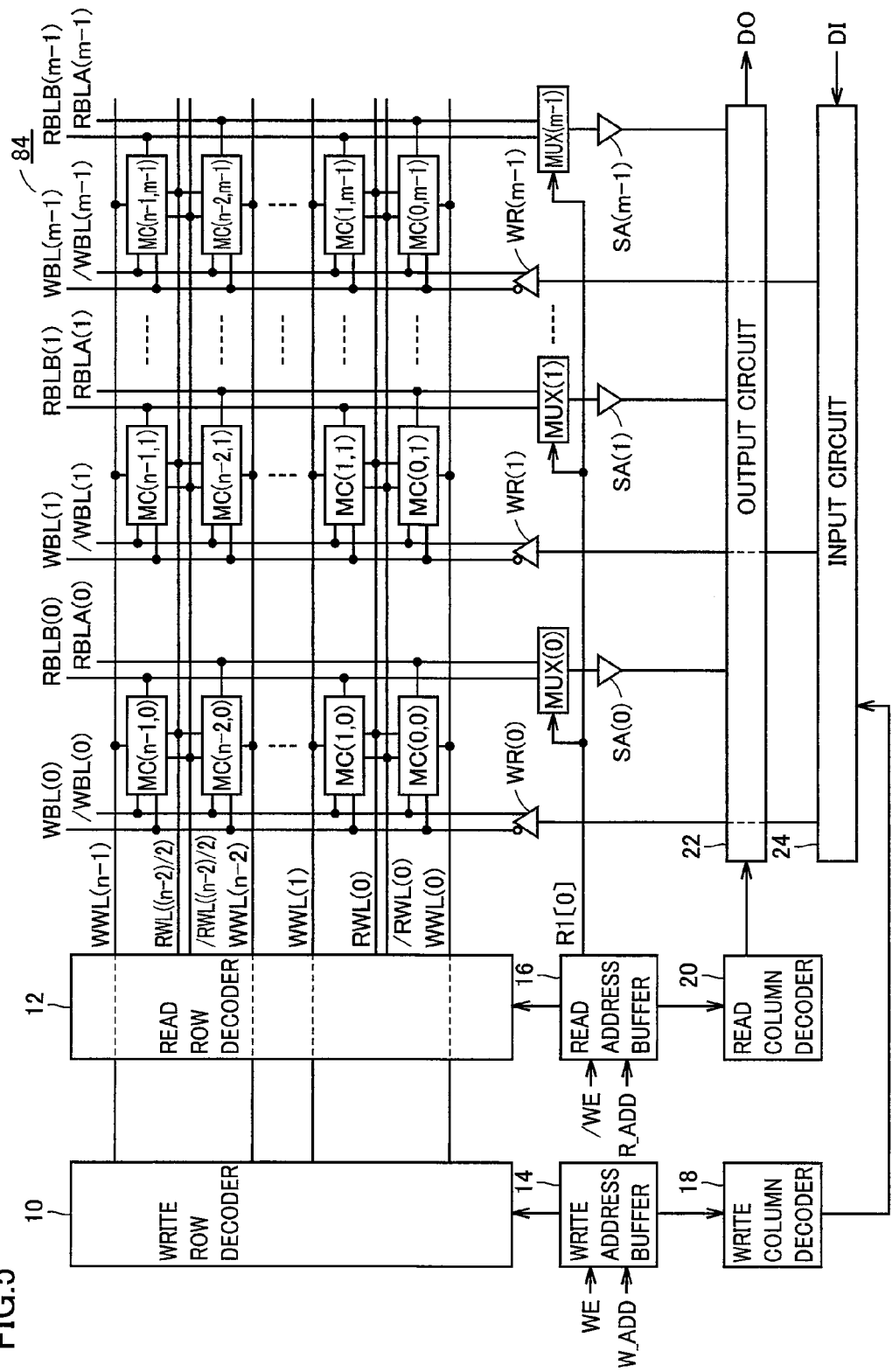
FIG. 5 is a block diagram that represents a schematic configuration of a semiconductor memory device according to a second embodiment.

FIG. 5 is a block diagram that represents a schematic configuration of a semiconductor memory device according to a second embodiment.

With reference to FIG. 5, the semiconductor memory device includes write address buffer 14, a read address buffer 16, write row decoder 10, a read row decoder 12, write column decoder 18, a read column decoder 20, input circuit 24, an output circuit 22, and a memory cell array 84.

Memory cell array 84 has a plurality of SRAM cells arranged in rows and columns. Given that the number of rows is n and the number of columns is m, that a row closest to and a row farthest from a write driver and a sense amplifier are provided with reference numbers 0 and (n−1), respectively, and that a column closest to and a column farthest from read row decoder 12 are provided with reference numbers 0 and (m−1), respectively, an SRAM cell located in the i-th row and the j-th column is denoted as MC (i, j). Here, two adjacent rows are made into a set. Specifically, two rows having reference numbers 0 and 1 are denoted as the 0th set, two rows having reference numbers 2 and 3 are denoted as the 1st set, and two rows having reference numbers (n−2) and (n−1) are denoted as the ((n−2)/2)-st set.

For the j-th column, there is provided a pair of write bit lines WBL (j), /WBL (j) of a positive phase and a negative phase. Memory cells MC (*, j) in the j-th column are connected to the pair of write bit lines WBL (j), /WBL (j) of a positive phase and a negative phase (* is 0 to (n−1)).

For the j-th column, there are provided a first read bit line RBLA (j) and a second read bit line RBLB (j). Memory cells MC (e, j) in even-numbered rows and the j-th column are connected to first read bit line RBLA (j) (e is an even number). Memory cells MC (o, j) in odd-numbered rows and the j-th column are connected to second read bit line RBLB (j) (o is an odd number).

For the i-th row, write word line WWL (i) is provided. Memory cells MC (i, *) in the i-th row are connected to write word line WWL (i) (* is 0 to (m−1)).

For the i-th set, there are provided read word lines RWL (i), /RWL (i) of a positive phase and a negative phase. Memory cells MC (2×i, *), MC (2×i+1, *) in the i-th set are connected to read word lines RWL (i), /RWL (i) of a positive phase and a negative phase (* is 0 to (m−1)).

When write enable signal WE of a positive phase is asserted, write address buffer 14 outputs a row-specifying portion of write address W_ADD inputted from an outside to write row decoder 10, and outputs a column-specifying portion of write address W_ADD to write column decoder 18.

When write enable signal /WE of a negative phase is asserted, read address buffer 16 outputs a row-address-set-specifying portion of a read address R_ADD inputted from an outside (bits of the row address except for the least significant bit) to read row decoder 12, outputs a portion that specifies a row in the row address set, of read address R_ADD (the least significant bit R [0] in the row address) to a selector MUX, and outputs a column-specifying portion of read address R_ADD to read column decoder 20.

Write row decoder 10 activates any one of write word lines WWL (i) (i=0 to (n−1)) in accordance with the row address in write address W_ADD transmitted from write address buffer 14.

Read row decoder 12 activates any one of read word lines RWL (i) (i=0 to (n−2)/2) of a positive phase in accordance with the row-address-set-specifying address in read address R_ADD transmitted from read address buffer 16, and deactivates read word line /RWL (i), which has a negative phase with respect to the activated read word line RWL (i).

Write column decoder 18 selects a column in accordance with the column address in write address W_ADD transmitted from write address buffer 14, and causes input circuit 24 to select write driver WR in the selected column.

Read column decoder 20 selects a column in accordance with the column address in read address R_ADD transmitted from read address buffer 16, and causes output circuit 22 to select an output signal of selector MUX in the selected column.

For the j-th column, there is provided a selector MUX (j) to which first read bit line RBLA (j) and second read bit line RBLB (j) are connected. Selector MUX (j) selects any one of first read bit line RBLA (j) and second read bit line RBLB (j), which are connected thereto, in accordance with an address R [0] that specifies a row in the row address set in read address R_ADD transmitted from read address buffer 16, and outputs a signal of the selected bit line to a sense amplifier SA (j).

For the j-th column, sense amplifier SA (j) is provided. Sense amplifier SA (j) amplifies the data transmitted from selector MUX (j), and transmits the amplified data to output circuit 22.

For the j-th column, write driver WR (j) is provided. Write driver WR (j) receives write data from input circuit 24, outputs data at a high or low level corresponding to the write data to write bit line WBL (j) of a positive phase, which is connected to write driver WR (j), and outputs reverse data at a high or low level corresponding to the write data to write bit line /WBL (j) of a negative phase, which is connected to write driver WR (j).

Input circuit 24 outputs write data DI inputted from an outside to write driver WR in the column specified by write column decoder 18.

Output circuit 22 receives data from sense amplifiers SA in m columns, selects data from sense amplifier SA in the column specified by read column decoder 20, and outputs the selected data to the outside as read data DO.

(Configuration of a Memory Cell)

Figure 6:
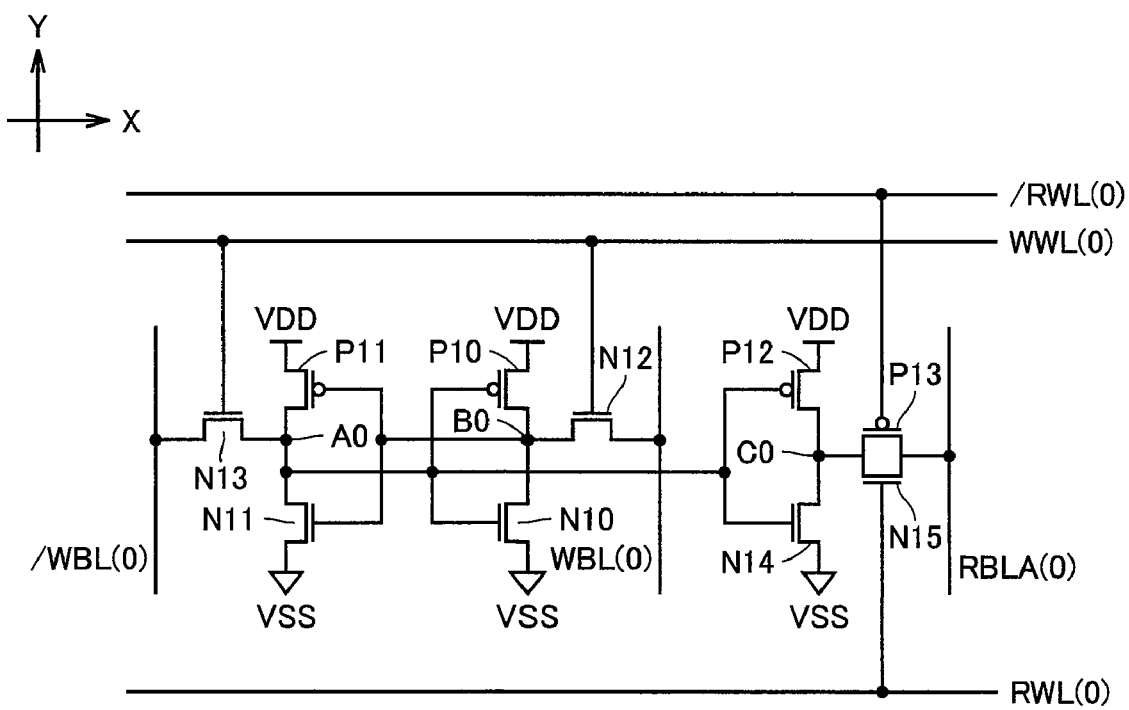
FIG. 6 is a circuit diagram that shows a configuration of a memory cell MC (0, 0) in FIG. 5.

FIG. 6 is a circuit diagram that shows a configuration of memory cell MC (0, 0) in FIG. 5.

With reference to FIG. 6, memory cell MC (0, 0) includes P-channel MOS transistors P10, P11, P12, P13, and N-channel MOS transistors N10, N11, N12, N13, N14, N15.

Further, memory cell MC (0, 0) is connected to write word line WWL (0) and the pair of read word lines RWL (0), /RWL (0) that extend along a direction of the rows. Further, memory cell MC (0, 0) is connected to the pair of write bit lines WBL (0), /WBL (0) and first read bit line RBLA (0) that extend along a direction of the columns.

P-channel MOS transistor P10 is connected between power supply node VDD and a storage node B0, and has its gate connected to a storage node A0. N-channel MOS transistor N10 is connected between storage node B0 and ground node VSS, and has its gate connected to storage node A0. P-channel MOS transistor P10 and N-channel MOS transistor N10 configure a first CMOS inverter.

P-channel MOS transistor P11 is connected between power supply node VDD and storage node A0, and has its gate connected to storage node B0. N-channel MOS transistor N11 is connected between storage node A0 and ground node VSS, and has its gate connected to storage node B0. P-channel MOS transistor P11 and N-channel MOS transistor N11 configure a second CMOS inverter.

Storage node B0 identified as an input of the first CMOS inverter is connected to an output of the second CMOS inverter. Storage node A0 identified as an input of the second CMOS inverter is connected to an output of the first CMOS inverter.

N-channel MOS transistor N12 is connected between storage node B0 and write bit line WBL (0) of a positive phase, and has a gate to which write word line WWL (0) is connected. N-channel MOS transistor N13 is connected between storage node A0 and write bit line /WBL (0) of a negative phase, and has a gate to which write word line WWL (0) is connected.

P-channel MOS transistor P12 is connected between power supply node VDD and a node C0, and has its gate connected to storage node A0. N-channel MOS transistor N14 is connected between node C0 and ground node VSS, and has its gate connected to storage node A0. P-channel MOS transistor P12 and N-channel MOS transistor N14 configure a third CMOS inverter. An output of the third CMOS inverter is connected to storage node A0.

P-channel MOS transistor P13 is connected between node C0 identified as an input of the third CMOS inverter and first read bit line RBLA (0), and has its gate connected to read word line /RWL (0) of a negative phase. N-channel MOS transistor N15 is connected between node C0 identified as an input of the third CMOS inverter and first read bit line RBLA (0), and has its gate connected to read word line RWL (0) of a positive phase. P-channel MOS transistor P13 and N-channel MOS transistor N15 configure a transfer gate.

Other memory cells in FIG. 5 have the same internal circuit configuration, except that corresponding pair of read word lines, write word line, pair of write bit lines, first read bit line, and second read bit line are connected thereto, and thus the description thereof will not be repeated.

(Exemplary Packaging of Memory Cells: Lower Layer)

Figure 7:
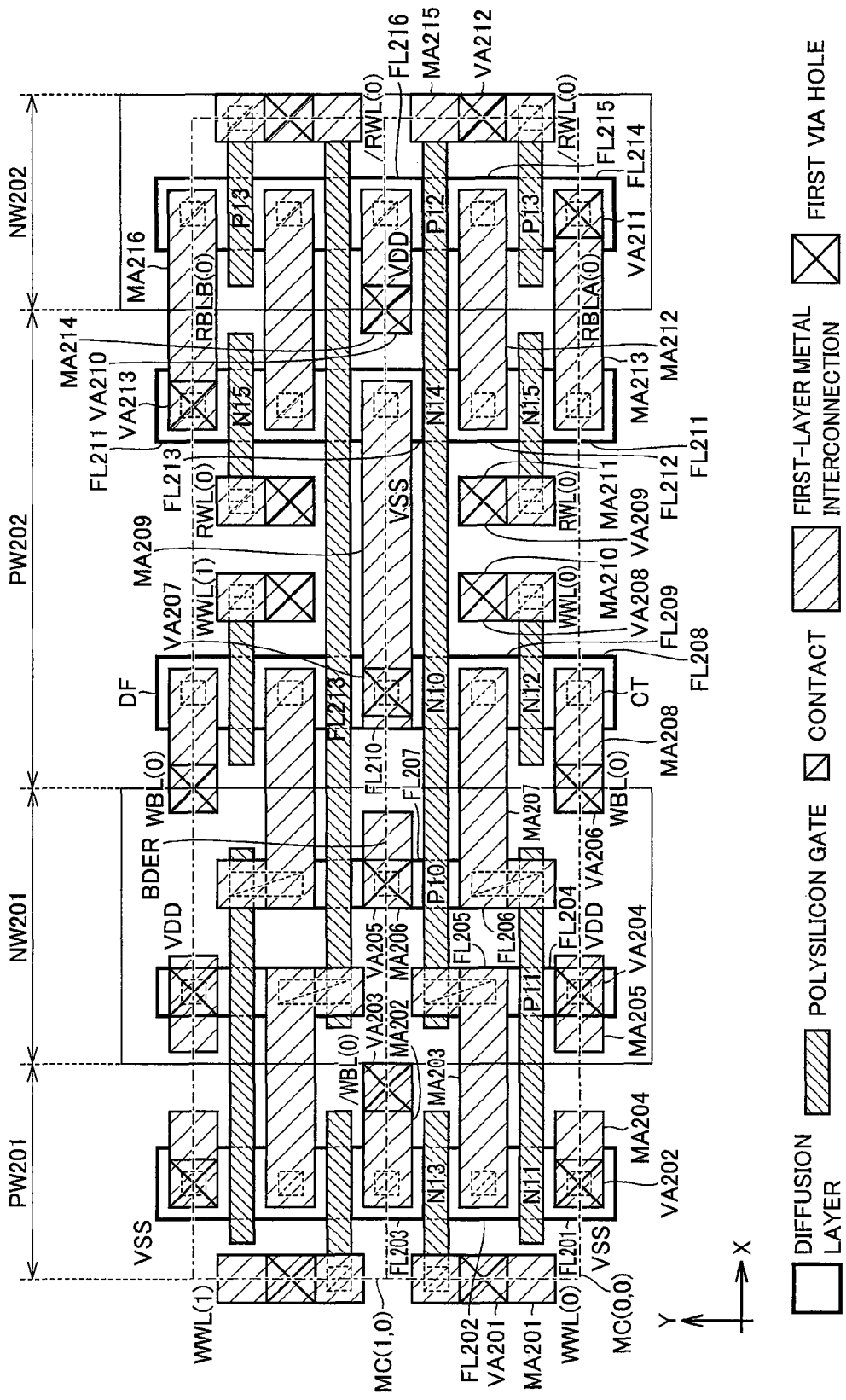
FIG. 7 is a plan view that shows an arrangement of a lower layer including a well, a diffusion region, a polysilicon, a contact hole, a first-layer metal interconnection, and a first via hole of a memory cell array in the second embodiment.

FIG. 7 is a plan view that shows an arrangement of a lower layer including a well, a diffusion region, a polysilicon, a contact hole, a first-layer metal interconnection, and a first via hole of a memory cell array in the second embodiment.

As shown in FIG. 7, memory cells for two bits, namely, memory cell MC (0, 0) and memory cell MC (1, 0) adjacent thereto in the Y direction are presented. In FIG. 7, reference characters are attached only to one contact hole CT, polycrystalline silicon (polysilicon) PO, and diffusion region DF as representative examples.

In memory cells MC (0, 0) and MC (1, 0), a P-well PW201, an N-well NW201, a P-well PW202, and an N-well NW202 are formed in this order in the positive direction of the X-axis at a surface of a semiconductor substrate. An N-channel MOS transistor is formed in each of P-wells PW201, PW202. A P-channel MOS transistor is formed in each of N-wells NW201, NW202.

Here, each of wells NW201, NW202, PW201, PW202 continues to the wells of all the other memory cells in the same column. In other words, wells NW201, NW202, PW201, PW202 extend in the Y-axis direction similarly as in the case of bit lines. Memory cell MC (0, 0) and memory cell MC (1, 0) are basically arranged symmetrically with respect to memory cell boundary BDER.

In FIG. 7, an arrangement in P-well PW201 and well NW201 is the same as the arrangement in P-well PW101 and well NW101 in the first embodiment in FIG. 3, and thus the description thereof will not be repeated.

(As to Memory Cell MC (0, 0))

Description will hereinafter be made on an arrangement in memory cell MC (0, 0).

N-channel MOS transistors N10, N12, N14, N15 are arranged in P-well PW202, and P-channel MOS transistors P12, P13 are arranged in N-well NW202.

An arrangement of N-channel MOS transistors N10, N12 is similar to the arrangement in FIG. 7, and thus the description thereof will not be repeated.

N-channel MOS transistor N14 has a source and a drain made of a pair of N-type diffusion regions FL213, FL212, and a gate formed of polysilicon arranged therebetween. N-type diffusion region FL213 is electrically connected to an upper layer via contact hole CT, a first-layer metal interconnection MA209, and a first via hole VA207, and is electrically connected to ground line VSS in the upper layer. N-type diffusion region FL212 is electrically connected to a P-type diffusion region FL215 via contact hole CT, a first-layer metal interconnection MA212, and contact hole CT. Further, the gate of N-channel MOS transistor N14 is formed of polysilicon PO common to the gates of N-channel MOS transistors N10 and P-channel MOS transistors P10, P12. Polysilicon PO is electrically connected to a P-type diffusion region FL205 via contact hole CT, and is further electrically connected to an N-type diffusion region FL202 via a first-layer metal interconnection MA203 and contact hole CT.

N-channel MOS transistor N15 has a source and a drain made of a pair of N-type diffusion regions FL211, FL212, and a gate formed of polysilicon arranged therebetween. N-type diffusion region FL211 is connected to the upper layer via contact hole CT, a first-layer metal interconnection MA213, and a first via hole VA211, and is electrically connected to first read bit line RBLA (0) in the upper layer. Further, N-type diffusion region FL211 is electrically connected to a P-type diffusion region FL214 via contact hole CT, a first-layer metal interconnection MA213, and contact hole CT. The gate of N-channel MOS transistor N15 is electrically connected to the upper layer via contact hole CT, a first-layer metal interconnection MA211, and a first via hole VA209, and is electrically connected to read word line RWL (0) in the upper layer.

P-channel MOS transistor P12 has a source and a drain made of a pair of P-type diffusion regions FL216, FL215, and a gate formed of polysilicon arranged therebetween. P-type diffusion region FL216 is electrically connected to the upper layer via contact hole CT, a first-layer metal interconnection MA214, and a first via hole VA210, and is electrically connected to power supply line VDD in the upper layer.

P-channel MOS transistor P13 has a source and a drain made of a pair of P-type diffusion regions FL214, FL215, and a gate formed of polysilicon arranged therebetween. The gate of P-channel MOS transistor P13 is electrically connected to the upper layer via contact hole CT, first-layer metal interconnection MA215, and a first via hole VA212, and is electrically connected to read word line /RWL (0) in the upper layer.

(As to Memory Cell MC (1, 0))

Memory cell MC (1, 0) and memory cell MC (0, 0) are basically arranged symmetrically with respect to memory cell boundary BDER. However, memory cell MC (1, 0) differs from memory cell MC (0, 0) on the following points because memory cell MC (0, 0) is connected to a first read bit line RBLA (0), whereas memory cell MC (1, 0) is connected to a second read bit line RBLB (0).

N-type diffusion region FL211 that forms N-channel MOS transistor N15 is electrically connected to the upper layer via contact hole CT, a first-layer metal interconnection MA216, and a first via hole VA213, and is electrically connected to second read bit line RBLB (0) in the upper layer. Further, first-layer metal interconnection MA216 has no first via hole for electrically connecting to first read bit line RBLA (0).

In FIG. 7, the diffusion region, the contact hole, the first-layer metal interconnection, and the first via hole arranged to be astride memory cell boundary BDER are shared by memory cell MC (0, 0) and memory cell MC (1, 0).

(Exemplary Packaging of Memory Cells: Upper Layer)

Figure 8:
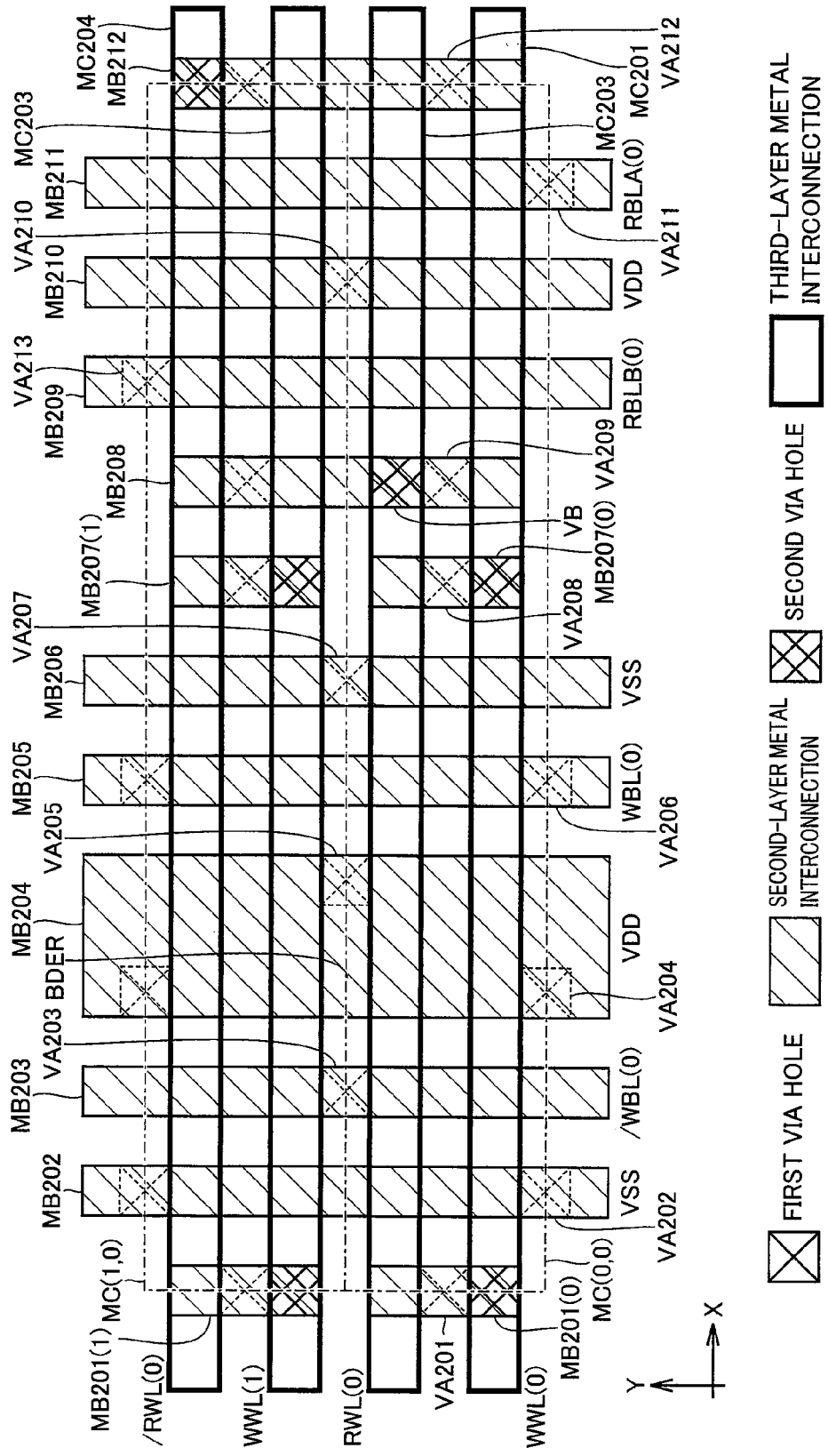
FIG. 8 is a plan view that shows an arrangement of an upper layer including a first via hole, a second-layer metal interconnection, a second via hole, and a third-layer metal interconnection in the second embodiment.

FIG. 8 is a plan view that shows an arrangement of the upper layer including a first via hole, a second-layer metal interconnection, a second via hole, and a third-layer metal interconnection in the second embodiment.

As shown in FIG. 8, memory cells for two bits, namely, memory cell MC (0, 0) and memory cell MC (1, 0) adjacent thereto in the Y direction are presented. In FIG. 8, a reference character is attached only to a second via hole VB located at a representative position.

The arrangement in FIG. 8 differs from the arrangement in the first embodiment in FIG. 4 as follows.

In FIG. 8, read word line RWL (0) is arranged in memory cell MC (0, 0), instead of first read word line RWL1 (0) in FIG. 4. Further, read word line /RWL (0) is arranged in memory cell MC (1, 0), instead of second read word line RWL2 (0) in FIG. 4.

A second-layer metal interconnection MB208 is thereby electrically connected to read word line RWL (0) via second via hole VB. Second-layer metal interconnection MB208 causes the polysilicon gates of N-channel MOS transistors N15 in memory cell MC (0, 0) and memory cell MC (1, 0) to be electrically connected to read word line RWL (0) in the common manner.

Further, a second-layer metal interconnection MB212 is electrically connected to read word line /RWL (0) via second via hole VB. Second-layer metal interconnection MB212 causes the polysilicon gates of P-channel MOS transistors P13 in memory cell MC (0, 0) and memory cell MC (1, 0) to be electrically connected to read word line /RWL (0) in the common manner.

In FIG. 8, second-layer metal interconnections MB209, MB210, MB211 are arranged in this order toward the positive direction of the X-axis, instead of fourth read bit line RBL2B (0) (MB109), third read bit line RBL2A (0) (MB110), second read bit line REL1B (0) (MB111), and first read bit line RBL1A (0) (MB112) in FIG. 4.

Second-layer metal interconnection MB209 is second read bit line RBLB (0) extending in the Y-axis direction. Second-layer metal interconnection MB209 is electrically connected to the lower layer in memory cell MC (1, 0) via first via hole VA213, and is electrically connected to first-layer metal interconnection MA216 in FIG. 7 in the lower layer. Second read bit line RBLB (0) is thereby electrically connected to diffusion region FL211 that configures N-channel MOS transistor N15 in memory cell MC (1,0).

Second-layer metal interconnection MB210 is power supply line VDD extending in the Y-axis direction. Second-layer metal interconnection MB210 is electrically connected to the lower layer via a first via hole VA210 arranged to be astride memory cell boundary BDER, and is electrically connected to first-layer metal interconnection MA214 in FIG. 7 in the lower layer. Power supply line VDD is thereby electrically connected to diffusion region FL216 that configures P-channel MOS transistor P12.

Second-layer metal interconnection MB211 is first read bit line RBLA (0) extending in the Y-axis direction. Second-layer metal interconnection MB211 is electrically connected to the lower layer in memory cell MC (0, 0) via first via hole VA211, and is electrically connected to a first-layer metal interconnection MA213 in FIG. 7 in the lower layer. First read bit line RBLA (0) is thereby electrically connected to diffusion region FL214 that configures P-channel MOS transistor P13 in memory cell MC (0, 0).

(Characteristics of the Layout of Memory Cells in the Embodiment of the Present Invention)

Description will hereinafter be made on characteristics of the layout of memory cells in the embodiment of the present invention.

(1) The layout of memory cells becomes longer in a horizontal direction, so that the length of the bit lines can be reduced. Therefore, data readout from the memory cells and data write to the memory cells can be performed at a high speed and with low power.

(2) The gates of all of the transistors in the memory cells are oriented in the same direction, and transistors N13, P10, N10, N14, P12 are aligned and transistors N11, P11, N12, N15, P13 are aligned. Therefore, lithography becomes easy and manufacturing variations can be prevented.

(3) The memory cells adjacent to each other in the column direction share the pair of read word lines RWL, /RWL. Moreover, in the memory cells adjacent to each other in the column direction, the memory cells in an even-numbered row are connected to first read bit line RBLA, and the memory cells in an odd-numbered row are connected to second read bit line RBLB. The number of interconnections extending in the word line direction (the X-axis direction, the direction of the rows) can thereby be reduced, and the length in the bit line direction (the Y-axis direction, the direction of the columns) can be reduced. Further, if the length in the bit line direction is set to be constant, the pitch of the interconnections can be increased, which makes it possible to reduce a coupling noise between the word lines.

(4) Between write bit line WBL or /WBL and first read bit line RBLA or second read bit line RBLB, at least ground line VSS is placed in the same interconnection layer, so that a shield is formed therebetween and a coupling noise can be reduced.

(5) Between first read bit line RBLA and second read bit line RBLB, power supply line VDD is placed in the same interconnection layer, so that a shield is formed therebetween and a coupling noise can be reduced.

(6) The read buffer circuit is configured with a CMOS inverter and a transfer gate, so that stable readout can be performed at a high speed.

Third Embodiment

An embodiment of the present invention relates to a modification of the exemplary packaging of the memory cells (the upper and lower layers) in the second embodiment.

(Exemplary Packaging of Memory Cells: Lower Layer)

Figure 9:
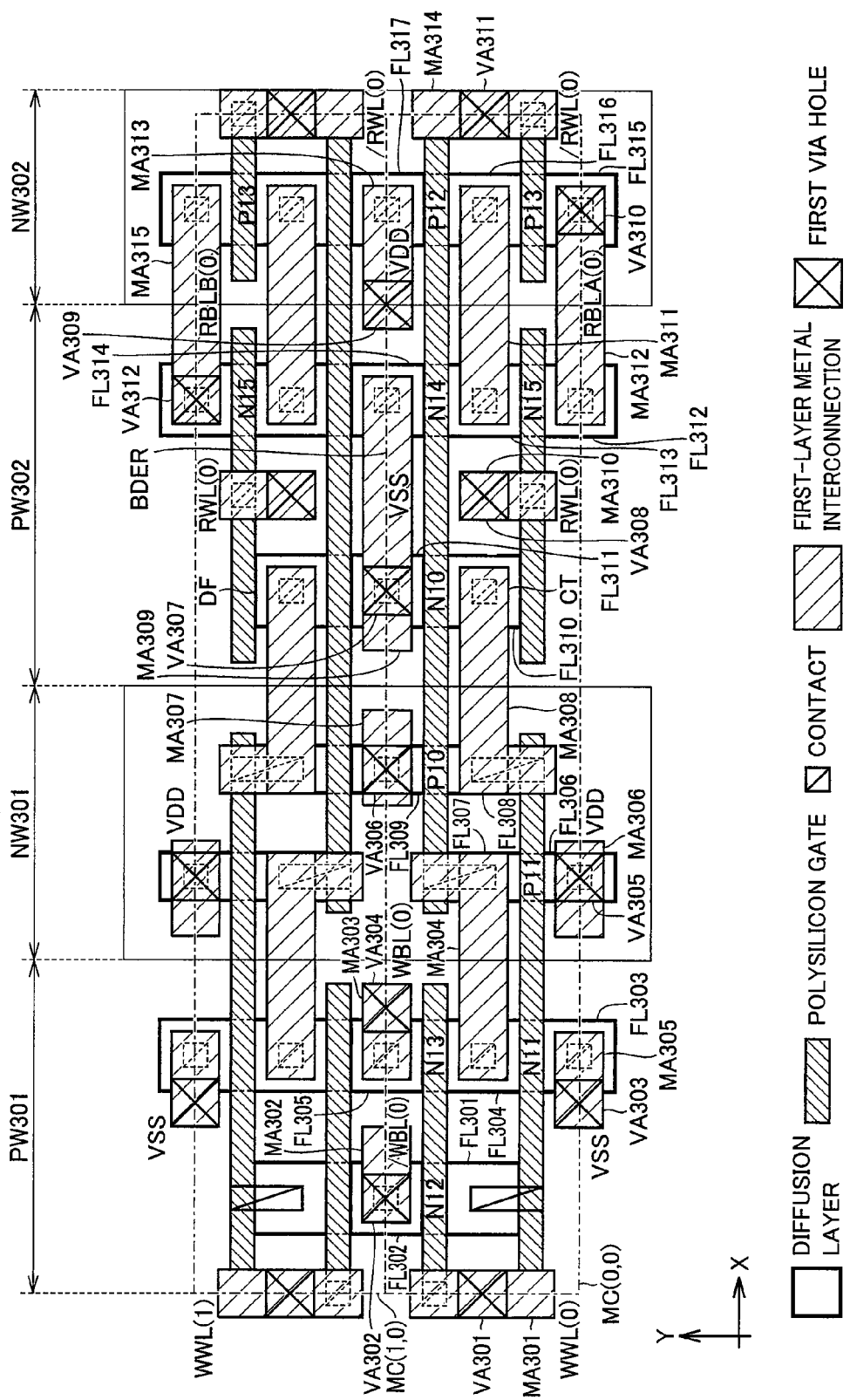
FIG. 9 is a plan view that shows an arrangement of a lower layer including a well, a diffusion region, a polysilicon, a contact hole, a first-layer metal interconnection, and a first via hole of a memory cell array in a third embodiment.

FIG. 9 is a plan view that shows an arrangement of the lower layer including a well, a diffusion region, a polysilicon, a contact hole, a first-layer metal interconnection, and a first via hole of a memory cell array in a third embodiment.

As shown in FIG. 9, memory cells for two bits, namely, memory cell MC (0, 0) and memory cell MC (1, 0) adjacent thereto in the Y direction are presented. In FIG. 9, reference characters are attached only to one contact hole CT, polycrystalline silicon (polysilicon) PO, and diffusion region DF as representative examples.

In memory cells MC (0, 0) and MC (1, 0), a P-well PW301, an N-well NW301, a P-well PW302, and an N-well NW302 are formed in this order in the positive direction of the X-axis at a surface of a semiconductor substrate. An N-channel MOS transistor is formed in each of P-wells PW301, PW302. A P-channel MOS transistor is formed in each of N-wells NW301, NW302.

Here, each of wells NW301, NW302, PW301, PW302 continues to the wells in all the other memory cells in the same column. In other words, wells NW301, NW302, PW301, PW302 extend in the Y-axis direction similarly as in the case of the bit lines. Memory cell MC (0, 0) and memory cell MC (1, 0) are basically arranged symmetrically with respect to memory cell boundary BDER.

(As to Memory Cell MC (0, 0))

Description will hereinafter be made on an arrangement in memory cell MC (0, 0).

P-channel MOS transistors P10, P11 are formed in N-well NW301. N-channel MOS transistors N11, N12, N13 are formed in P-well PW301. N-channel MOS transistors N0, N14, N15 are formed in P-well PW302. P-channel MOS transistors P12, P13 are formed in N-well NW302.

P-channel MOS transistor P10 has a source and a drain made of a pair of P-type diffusion regions FL308, FL309, and a gate formed of polysilicon arranged therebetween. P-type diffusion region FL309 is electrically connected to an upper layer via contact hole CT, a first-layer metal interconnection MA307, and a first via hole VA306, and is electrically connected to power supply line VDD in the upper layer. P-type diffusion region FL308 is electrically connected to an N-type diffusion region FL310 via contact hole CT, a first-layer metal interconnection MA308, and contact hole CT. Further, P-type diffusion region FL308 is electrically connected to the polysilicon gates of P-channel MOS transistor P11 and N-channel MOS transistor N11 via contact hole CT and first-layer metal interconnection MA308, and is further electrically connected to N-type diffusion region FL301 via contact hole CT. Further, the gate of P-channel MOS transistor P10 is formed of polysilicon PO common to the gates of N-channel MOS transistors N1, N14 and P-channel MOS transistor P12. Polysilicon PO is electrically connected to P-type diffusion region FL307 via contact hole CT, and is further electrically connected to N-type diffusion region FL304 via a first-layer metal interconnection MA304 and contact hole CT.

P-channel MOS transistor P11 has a source and a drain made of a pair of P-type diffusion regions FL306, FL307, and a gate formed of polysilicon arranged therebetween. P-type diffusion region FL306 is electrically connected to the upper layer via contact hole CT, a first-layer metal interconnection MA306, and a first via hole VA305, and is electrically connected to power supply line VDD in the upper layer.

N-channel MOS transistor N12 has a source and a drain made of a pair of N-type diffusion regions FL301, FL302, and a gate formed of polysilicon arranged therebetween. N-type diffusion region FL302 is electrically connected to the upper layer via contact hole CT, a first-layer metal interconnection MA302, and a first via hole VA302, and is electrically connected to write bit line /WBL (0) in the upper layer. A gate of N-channel MOS transistor N12 is formed of polysilicon PO common to the gate of N-channel MOS transistor N13. Polysilicon PO is electrically connected to write word line WWL (0) via contact hole CT, a first-layer metal interconnection MA301, and a first via hole VA301.

N-channel MOS transistor N13 has a source and a drain made of a pair of N-type diffusion regions FL304, FL305, and a gate formed of polysilicon arranged therebetween. N-type diffusion region FL305 is electrically connected to the upper layer via contact hole CT, a first-layer metal interconnection MA303, and a first via hole VA304, and is electrically connected to write bit line WBL (0) in the upper layer.

N-channel MOS transistor N11 has a source and a drain made of a pair of N-type diffusion regions FL303, FL304, and a gate formed of polysilicon arranged therebetween. N-type diffusion region FL303 is electrically connected to the upper layer via contact hole CT, a first-layer metal interconnection MA305, and a first via hole VA303, and is electrically connected to ground line VSS in the upper layer.

N-channel MOS transistor N10 has a source and a drain made of a pair of N-type diffusion regions FL310, FL311, and a gate formed of polysilicon arranged therebetween. N-type diffusion region FL310 is electrically connected to an N-type diffusion region FL314 via contact hole CT, first-layer metal interconnection MA309, and contact hole CT. Further, N-type diffusion region FL310 is electrically connected to the upper layer via contact hole CT, first-layer metal interconnection MA309, and a first via hole VA307, and is electrically connected to ground line VSS in the upper layer.

N-channel MOS transistor N14 has a source and a drain made of a pair of N-type diffusion regions FL313, FL314, and a gate formed of polysilicon arranged therebetween. N-type diffusion region FL313 is electrically connected to a P-type diffusion region FL316 via contact hole CT, a first-layer metal interconnection MA311, and contact hole CT.

N-channel MOS transistor N15 has a source and a drain made of a pair of N-type diffusion regions FL312, FL313, and a gate formed of polysilicon arranged therebetween. N-type diffusion region FL312 is electrically connected to P-type diffusion region FL315 via contact hole CT, a first-layer metal interconnection MA312, and contact hole CT. Further, N-type diffusion region FL312 is electrically connected to the upper layer via contact hole CT, first-layer metal interconnection MA312, and a first via hole VA310, and is electrically connected to first read bit line RBLA (0) in the upper layer. A polysilicon gate of N-channel MOS transistor N15 is electrically connected to read word line RWL (0) via contact hole CT, a first-layer metal interconnection MA310, and a first via hole VA308.

P-channel MOS transistor P12 has a source and a drain made of a pair of N-type diffusion regions FL316, FL317, and a gate made of polysilicon arranged therebetween. P-type diffusion region FL317 is electrically connected to the upper layer via contact hole CT, a first-layer metal interconnection MA313, and a first via hole VA309, and is electrically connected to power supply line VDD in the upper layer.

P-channel MOS transistor P13 has a source and a drain made of a pair of N-type diffusion regions FL315, FL316, and a gate formed of polysilicon arranged therebetween. A polysilicon gate of P-channel MOS transistor P13 is electrically connected to read word line /RWL (0) via contact hole CT, a first-layer metal interconnection MA314, and a first via hole VA311.

(As to Memory Cell MC (1, 0))

Memory cell MC (1, 0) and memory cell MC (0, 0) are basically arranged symmetrically with respect to memory cell boundary BDER. However, memory cell MC (1, 0) differs from memory cell MC (0, 0) on the following points because memory cell MC (0, 0) is connected to first read bit line RBLA (0), whereas memory cell MC (1, 0) is connected to second read bit line RBLB (0).

N-type diffusion region FL312 that forms N-channel MOS transistor N15 is electrically connected to the upper layer via contact hole CT, a first-layer metal interconnection MA315, and a first via hole VA312, and is electrically connected to second read bit line RBLB (0) in the upper layer. Further, first-layer metal interconnection MA315 has no first via hole for electrically connecting to first read bit line RBLA (0).

In FIG. 9, the diffusion region, the contact hole, the first-layer metal interconnection, and the first via hole arranged to be astride memory cell boundary BDER are shared by memory cell MC (0, 0) and memory cell MC (1, 0).

(Exemplary Packaging of Memory Cells: Upper Layer)

Figure 10:
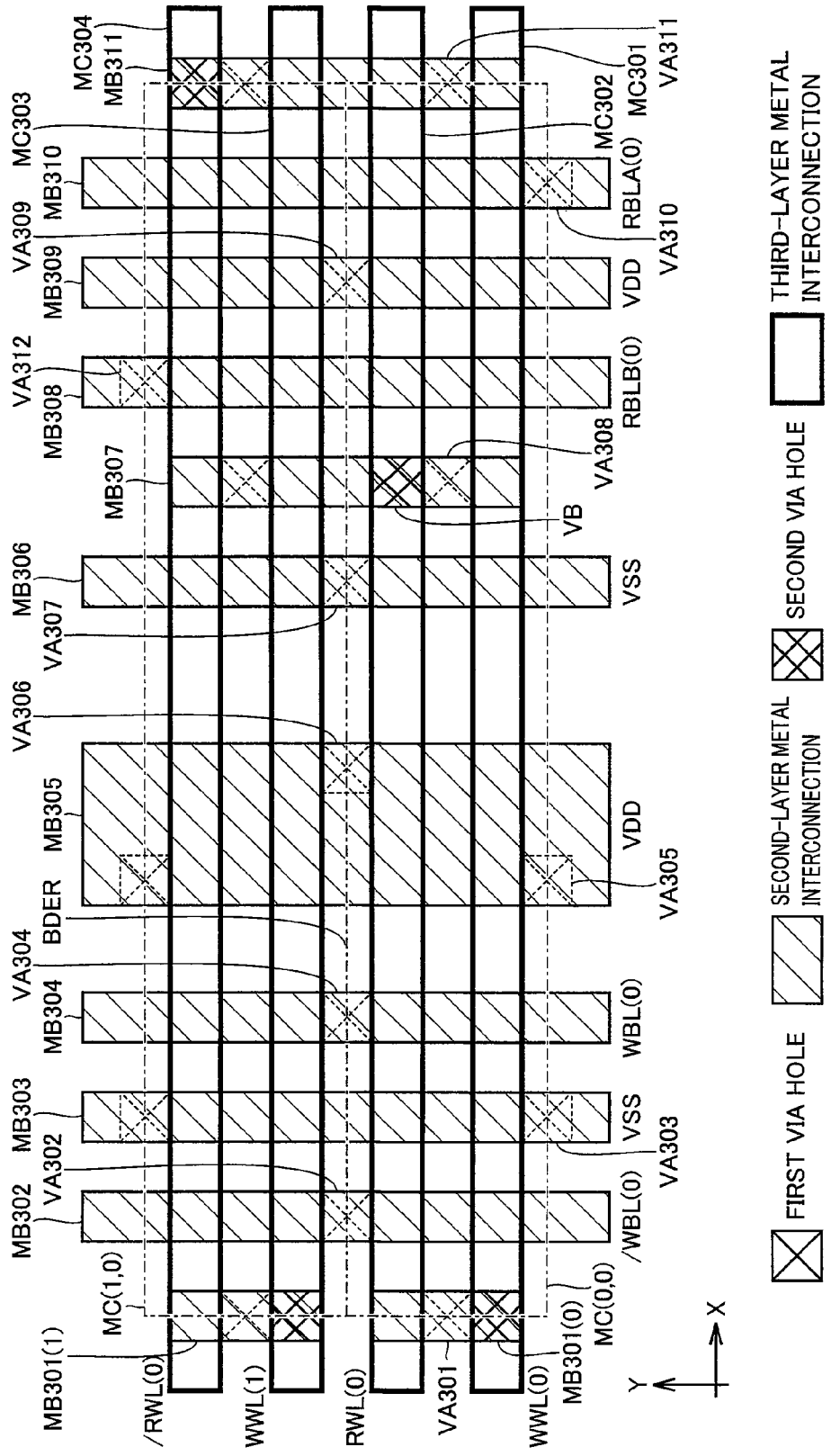
FIG. 10 is a plan view that shows an arrangement of an upper layer including a first via hole, a second-layer metal interconnection, a second via hole, and a third-layer metal interconnection in the third embodiment.

FIG. 10 is a plan view that shows an arrangement of the upper layer including a first via hole, a second-layer metal interconnection, a second via hole, and a third-layer metal interconnection in the third embodiment.

As shown in FIG. 10, memory cells for two bits, namely, memory cell MC (0, 0) and memory cell MC (1, 0) adjacent thereto in the Y direction are presented. In FIG. 10, a reference character is attached only to a second via hole VB located at a representative position.

In memory cells MC (0, 0), MC (1, 0), the second-layer metal interconnections are arranged along the Y-axis direction, and the third-layer metal interconnections are arranged along the X-axis direction. The second-layer metal interconnections and the first-layer metal interconnections located in the underlayer as shown in FIG. 9 are electrically connected via first via holes VA. The second-layer metal interconnections and the third-layer metal interconnections located in the upper layer are electrically connected via second via holes VB. Some of the second-layer metal interconnections continue to all the other memory cells in the same column and extend in the Y-axis direction, and other of the second-layer metal interconnections exist only in a single memory cell or in two memory cells adjacent in the Y direction, and are separated from the second-layer metal interconnection in other memory cells in the same column. The third-layer metal interconnections continue to all the other memory cells in the same row, and extend in the X-axis direction.

Second-layer metal interconnections MB301 (0 and 1), MB302, MB303, MB304, MB305, MB306, MB307, MB308, MB309, MB310, MB111 are arranged in this order toward the positive direction of the X-axis.

In memory cell MC (0, 0), third-layer metal interconnections MC301, MC302 are arranged in this order from the bottom in the Y-axis direction, and in memory cell MC (1, 0), third-layer metal interconnections MC303, MC304 are arranged in this order toward the positive direction of the Y-axis.

Third-layer metal interconnection MC 301 is write word line WWL (0) extending in the X-axis direction. Third-layer metal interconnection MC302 is read word line RWL (0) extending in the X-axis direction. Third-layer metal interconnection MC303 is write word line WWL (1) extending in the X-axis direction. Third-layer metal interconnection MC304 is read word line /RWL (0) extending in the X-axis direction.

Second-layer metal interconnection MB302 is write bit line /WBL (0) extending in the Y-axis direction. Second-layer metal interconnection MB302 is electrically connected to the lower layer via first via hole VA302 arranged to be astride memory cell boundary BDER, and is electrically connected to first-layer metal interconnection MA302 in FIG. 9 in the lower layer. Write bit line /WBL (0) is thereby electrically connected to diffusion region FL302 that configures N-channel MOS transistor N12.

Second-layer metal interconnection MB303 is ground line VSS extending in the Y-axis direction. In memory cell MC (0, 0), second-layer metal interconnection MB303 is electrically connected to the lower layer via first via hole VA303, and is electrically connected to first-layer metal interconnection MA305 in FIG. 9 in the lower layer. In memory cell MC (1, 0) as well, second-layer metal interconnection MB303 is electrically connected to the lower layer via a first via hole located at a position symmetric to first via hole VA303 with respect to memory cell boundary BDER. Ground line VSS is thereby electrically connected to diffusion region FL303 that configures N-channel MOS transistor N11.

Second-layer metal interconnection MB304 is write bit line WBL (0) extending in the Y-axis direction. Second-layer metal interconnection MB304 is electrically connected to the lower layer via first via hole VA304 arranged to be astride memory cell boundary BDER, and is electrically connected to first-layer metal interconnection MA303 in FIG. 9 in the lower layer. Write bit line WBL (0) is thereby electrically connected to diffusion region FL305 that configures N-channel MOS transistor N13.

Second-layer metal interconnection MB305 is power supply line VDD extending in the Y-axis direction. In memory cell MC (0, 0), second-layer metal interconnection MB305 is electrically connected to the lower layer via first via hole VA305, and is electrically connected to first-layer metal interconnection MA306 in FIG. 9 in the lower layer. In memory cell MC (1, 0) as well, second-layer metal interconnection MB305 is electrically connected to the lower layer via a first via hole located at a position symmetric to first via hole VA305 with respect to memory cell boundary BDER. Further, second-layer metal interconnection MB305 is electrically connected to the lower layer via first via hole VA306 arranged to be astride memory cell boundary BDER, and is electrically connected to first-layer metal interconnection MA307 in FIG. 9 in the lower layer. Power supply line VDD is thereby electrically connected to diffusion region FL306 that configures P-channel MOS transistor P11, and diffusion region FL309 that configures P-channel MOS transistor P10.

Second-layer metal interconnection MB306 is ground line VSS extending in the Y-axis direction. Second-layer metal interconnection MB306 is electrically connected to the lower layer via a first via hole VA307 arranged to be astride memory cell boundary BDER, and is electrically connected to first-layer metal interconnection MA309 in FIG. 9 in the lower layer. Ground line VSS is thereby electrically connected to diffusion region FL311 that configures N-channel MOS transistor N10.

Second-layer metal interconnection MB309 is power supply line VDD extending in the Y-axis direction. Second-layer metal interconnection MB309 is electrically connected to the lower layer via first via hole VA309 arranged to be astride memory cell boundary BDER, and is electrically connected to first-layer metal interconnection MA313 in FIG. 9 in the lower layer. Power supply line VDD is thereby electrically connected to diffusion region FL317 that configures P-channel MOS transistor P12.

Second-layer metal interconnection MB308 is second read bit line RBLB (0) extending in the Y-axis direction. In memory cell MC (1, 0), second-layer metal interconnection MB308 is electrically connected to the lower layer via first via hole VA312, and is electrically connected to first-layer metal interconnection MA315 in FIG. 9 in the lower layer. Second read bit line RBLB (0) is thereby electrically connected to diffusion region FL312 that configures N-channel MOS transistor N15 in memory cell MC (1, 0).

Second-layer metal interconnection MB310 is first read bit line RBLA (0) extending in the Y-axis direction. In memory cell MC (0, 0), second-layer metal interconnection MB310 is electrically connected to the lower layer via first via hole VA310, and is electrically connected to first-layer metal interconnection MA312 in FIG. 9 in the lower layer. First read bit line RBLA (0) is thereby electrically connected to diffusion region FL312 that configures N-channel MOS transistor N15 and diffusion region FL315 that configures P-channel MOS transistor P13, in memory cell MC (0, 0).

Second-layer metal interconnection MB301 (0) exists only in memory cell MC (0, 0). Second-layer metal interconnection MB301 (0) is electrically connected to the lower layer via first via hole VA301, and is electrically connected to first-layer metal interconnection MA301 in FIG. 9 in the lower layer. Further, second-layer metal interconnection MB301 (0) is electrically connected to third-layer metal interconnection MC301, which is identified as write word line WWL (0), via second via hole VB. Second-layer metal interconnection MB301 (0) electrically connects write word line WWL (0) and a polysilicon gate of N-channel MOS transistor N13. Second-layer metal interconnection MB301 (1) exists only in memory cell MC (1, 0), and has a function similar to the function of second-layer metal interconnection MB301 (0).

Second-layer metal interconnection MB307 exists only in memory cell MC (0, 0) and memory cell MC (1, 0) adjacent thereto in the Y direction. In memory cell MC (0, 0), second-layer metal interconnection MB307 is electrically connected to the lower layer via first via hole VA308, and is electrically connected to first-layer metal interconnection MA310 in FIG. 9 in the lower layer. Further, in memory cell MC (1, 0) as well, second-layer metal interconnection MB307 is electrically connected to the lower layer via a first via hole located at a position symmetric to first via hole VA308 with respect to memory cell boundary BDER. Further, second-layer metal interconnection MB307 is electrically connected to third-layer metal interconnection MC302, which is identified as read word line RWL (0), via second via hole VB in memory cell MC (0, 0). Second-layer metal interconnection MB307 causes the polysilicon gates of N-channel MOS transistors N15 in memory cell MC (0, 0) and memory cell MC (1, 0) to be electrically connected to read word line RWL (0).

Second-layer metal interconnection MB311 exists only in memory cell MC (0, 0) and memory cell MC (1, 0) adjacent thereto in the Y direction. In memory cell MC (0, 0), second-layer metal interconnection MB311 is electrically connected to the lower layer via first via hole VA311, and is electrically connected to first-layer metal interconnection MA314 in FIG. 9 in the lower layer. Further, in memory cell MC (1, 0) as well, second-layer metal interconnection MB311 is electrically connected to the lower layer via a first via hole located at a position symmetric to first via hole VA311 with respect to memory cell boundary BDER. Further, second-layer metal interconnection MB311 is electrically connected to third-layer metal interconnection MC304, which is identified as read word line /RWL (0), via second via hole VB in memory cell MC (0, 1). Second-layer metal interconnection MB311 causes the polysilicon gates of N-channel MOS transistors P13 in memory cell MC (0, 0) and memory cell MC (1, 0) to be electrically connected to read word line /RWL (0) in the common manner.

(Characteristics of the Layout of Memory Cells in the Embodiment of the Present Invention)

Description will hereinafter be made on characteristics of the layout of memory cells in the embodiment of the present invention.

Like the second embodiment, the embodiment of the present invention has characteristics (1), (3), (5), and (6) described in the second embodiment. Further, the embodiment of the present invention has the following characteristics.

(2)' The gates of all the transistors in the memory cells are oriented in the same direction, and transistors N12, N13, P10, N10, N14, P12 are aligned, and transistors N11, P11, N15, P13 are aligned. Therefore, lithography becomes easy and manufacturing variations can be prevented.

(4)' Between write bit line WBL or /WBL and first read bit line RBLA or second read bit line RBLB, power supply line VDD and ground line VSS are placed in the same interconnection layer, so that a shield is formed therebetween and a coupling noise can be reduced.

Fourth Embodiment

An embodiment of the present invention relates to a modification of the structure inside the SRAM cell in the second embodiment.

(Configuration of Memory Cells)

Figure 11:
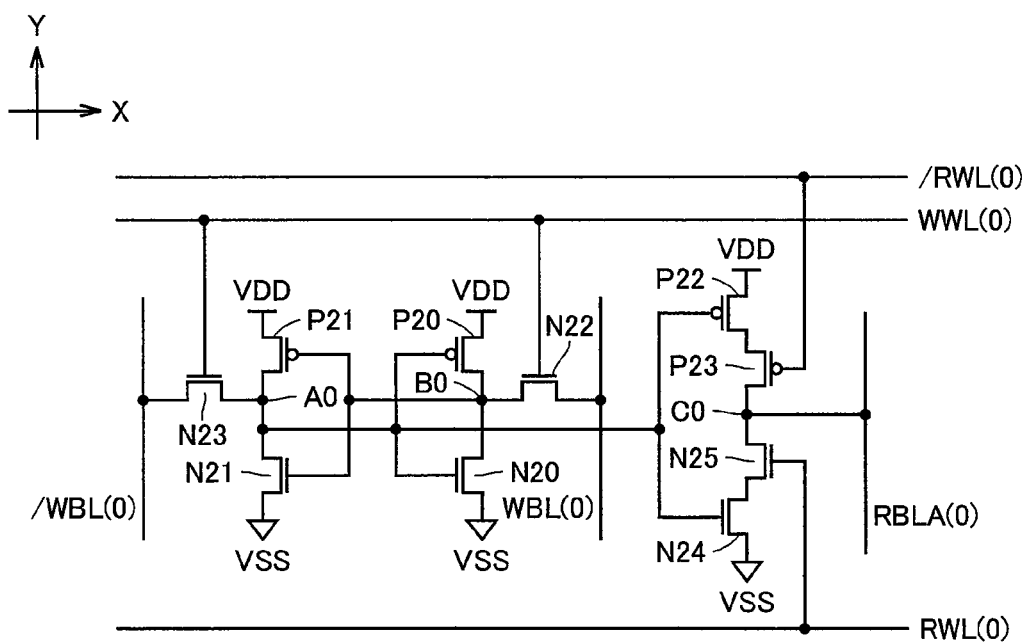
FIG. 11 is a circuit diagram that shows another configuration of memory cell MC (0, 0) in FIG. 5.

FIG. 11 is a circuit diagram that shows another configuration of memory cell MC (0, 0) in FIG. 5.

With reference to FIG. 11, memory cell MC (0, 0) includes P-channel MOS transistors P20, P21, P22, P23, and N-channel MOS transistors N20, N21, N22, N23, N24, N25.

Further, memory cell MC (0, 0) is connected to write word line WWL (0) and the pair of read word lines RWL (0), /RWL (0) that extend along the direction of the rows. Further, memory cell MC (0, 0) is connected to the pair of write bit lines WBL (0), /WBL (0) and first read bit line RBLA (0) that extend along the direction of the columns.

P-channel MOS transistor P20 is connected between power supply node VDD and storage node B0, and has its gate connected to storage node A0. N-channel MOS transistor N20 is connected between storage node B0 and ground node VSS, and has its gate connected to storage node A0. P-channel MOS transistor P20 and N-channel MOS transistor N20 configure a first CMOS inverter.

P-channel MOS transistor P21 is connected between power supply node VDD and storage node A0, and has its gate connected to storage node B0. N-channel MOS transistor N21 is connected between storage node A0 and ground node VSS, and has its gate connected to storage node B0. P-channel MOS transistor P21 and N-channel MOS transistor N21 configure a second CMOS inverter.

Storage node B0 identified as an input of the first CMOS inverter, and an output of the second CMOS inverter are connected. Storage node A0 identified as an input of the second CMOS inverter, and an output of the first CMOS inverter are connected.

N-channel MOS transistor N22 is connected between storage node B0 and write bit line WBL (0) of a positive phase, and has a gate to which write word line WWL (0) is connected. N-channel MOS transistor N23 is connected between storage node A0 and write bit line /WBL (0) of a negative phase, and has a gate to which write word line WWL (0) is connected.

P-channel MOS transistors P22, P23 and N-channel MOS transistors N25, N24 connected in series between power supply node VDD and ground node VSS configure a tristate inverter.

Node C0 identified as an input of the tristate inverter is connected to first read bit line RBLA (0). An output of the tristate inverter is connected to storage node A0.

The gate of P-channel MOS transistor P23 is connected to read word line /RWL (0) of a negative phase. The gate of N-channel MOS transistor N25 is connected to read word line RWL (0) of a positive phase.

(Effects of Reducing Leakage Current)

A read buffer circuit in the embodiment of the present invention is configured with a tristate inverter circuit, and is thus excellent in its effect of reducing leakage current flowing from power supply VDD to ground node VSS.

In the circuit configuration in the second embodiment in FIG. 6, power supply VDD and ground node VSS are connected via transistor P12 and transistor N14, causing a flow of leakage current determined by an off state of any of these transistors.

In contrast, in the circuit configuration in FIG. 11 in the embodiment of the present invention, power supply VDD and ground node VSS are connected via transistors P22, P23, and transistors N24, N25, so that leakage current is reduced. This is generally referred to as a leakage current reduction method caused by a stack effect. Description will be given by taking a standby state as an example. In the standby state, both of transistors P23, N25 are in an off state. One of transistors P22, N24 is turned on and the other of transistors P22, N24 is turned off in accordance with the data held in the memory cell. For example, when data at a high level is held at storage node A0, transistor N24 is turned on and transistor P22 is turned off. Since both of transistor P22 and transistor P23 are off, an intermediate node of transistors P22, P23 connected in series has an intermediate potential. Therefore, a substrate bias effect is exerted on transistor P23, so that leakage current between the drain and the source is further reduced than in the normal off state. Accordingly, leakage current flowing from power supply VDD to ground node VSS is reduced.

Other memory cells in FIG. 11 have the same internal circuit configuration, except that corresponding read word line, write word line, pair of write bit lines, and read bit line are connected thereto, and thus the description thereof will not be repeated. Therefore, for example, a memory cell MC (i, j) in the i-th row and the j-th column includes the pair of write bit lines WBL (i), /WBL (i).

Further, if i is an odd number, memory cell MC (i, j) includes second read bit line RBLB (j) and the pair of read word lines RWL ((i−1)/2), /RWL ((i−1)/2). If i is an even number, memory cell MC (i, j) includes first read bit line RBLA (j) and the pair of read word lines RWL (i/2), /RWL (i/2).

(Exemplary Packaging of Memory Cells: Lower Layer)

Figure 12:
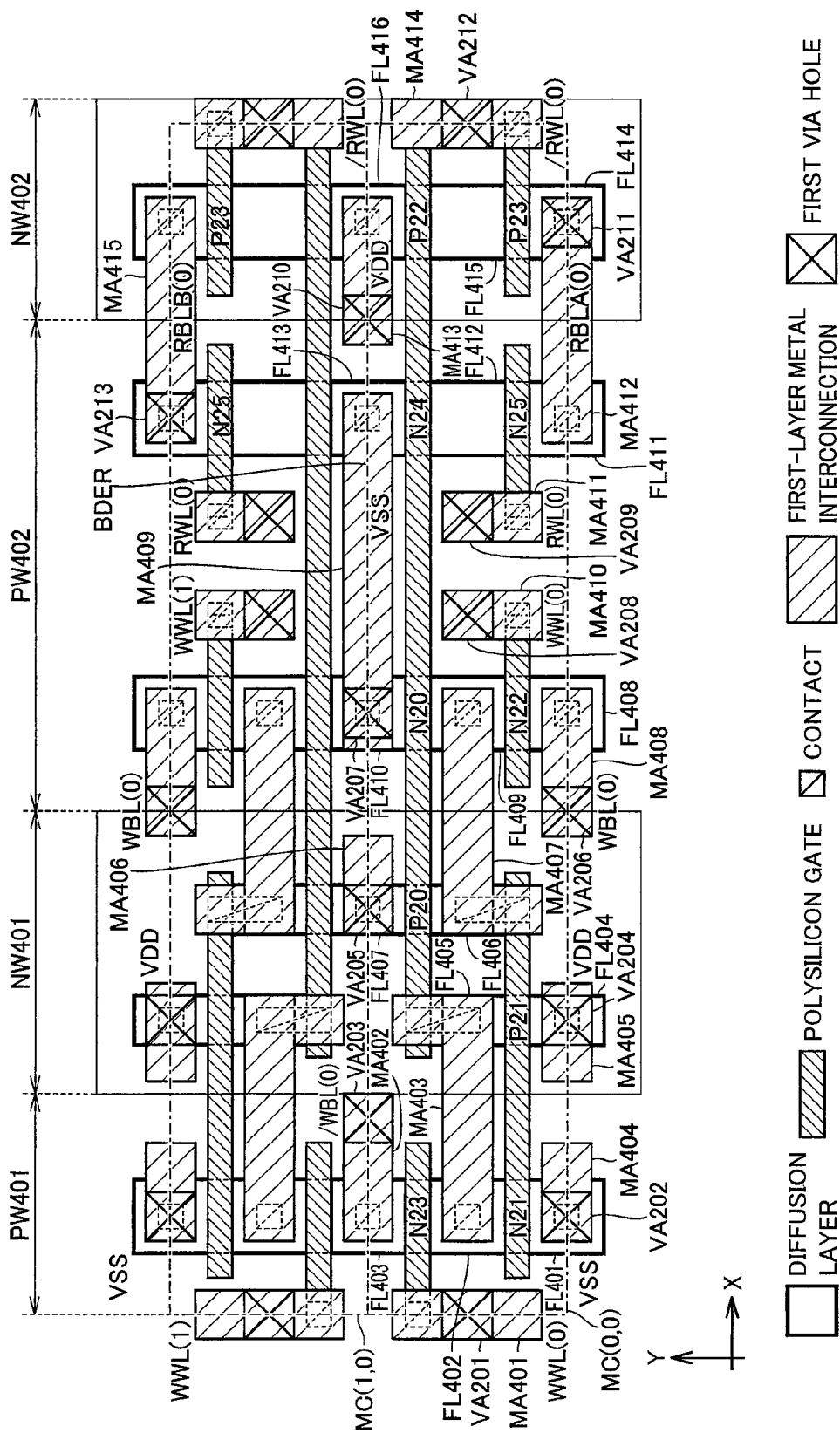
FIG. 12 is a plan view that shows an arrangement of a lower layer including a well, a diffusion region, a polysilicon, a contact hole, a first-layer metal interconnection, and a first via hole of a memory cell array in a fourth embodiment.

FIG. 12 is a plan view that shows an arrangement of the lower layer including a well, a diffusion region, a polysilicon, a contact hole, a first-layer metal interconnection, and a first via hole of a memory cell array in the fourth embodiment.

The arrangement in FIG. 12 differs from the arrangement in the second embodiment in FIG. 7 on the following points.

In other words, in the second embodiment in FIG. 7, contact hole CT is arranged in N-type diffusion region FL212 that configures N-channel MOS transistors N14, N15, and contact hole CT is arranged in P-type diffusion region FL215 that configures P-channel MOS transistors P12, P13, and these contact holes CT are electrically connected via first-layer metal interconnection MA212. Therefore, in the second embodiment, P-channel MOS transistor P13 is connected to N-channel MOS transistor N14, and P-channel MOS transistor P12 is connected to N-channel MOS transistor N15.

In contrast, in the fourth embodiment in FIG. 12, contact hole CT is not arranged in an N-type diffusion region FL412 that configures N-channel MOS transistors N24, N25, and contact hole CT is not arranged in a P-type diffusion region FL415 that configures P-channel MOS transistors P22, P23. Since no contact hole CT exists, there exists no first-layer metal interconnection for connecting contact holes. As a result, in the fourth embodiment, P-channel MOS transistor P23 is not connected to N-channel MOS transistor N24, and P-channel MOS transistor P22 is not connected to N-channel MOS transistor N25.

(Exemplary Packaging of Memory Cells: Upper Layer)

Figure 13:
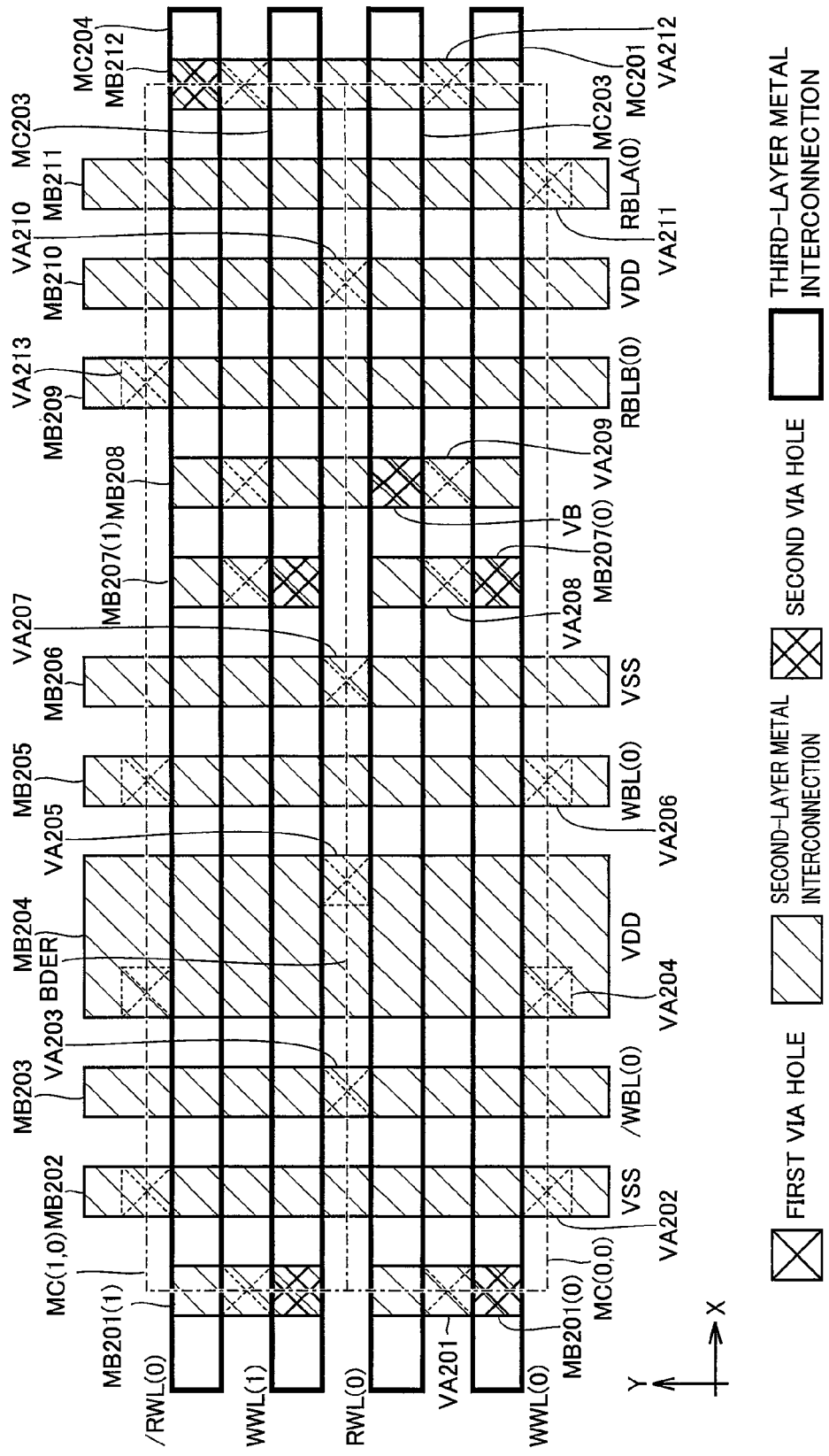
FIG. 13 is a plan view that shows an arrangement of an upper layer including a first via hole, a second-layer metal interconnection, a second via hole, and a third-layer metal interconnection in the fourth embodiment.

FIG. 13 is a plan view that shows an arrangement of the upper layer including a first via hole, a second-layer metal interconnection, a second via hole, and a third-layer metal interconnection in the fourth embodiment.

The arrangement in the upper layer in the fourth embodiment is similar to the arrangement in the upper layer in the second embodiment shown in FIG. 8, and thus the description thereof will not be repeated.

(Differences in Layout Over the Circuit in FIG. 6)

The layout of the circuit in the embodiment of the present invention and the layout of the circuit in the second embodiment are the same except for some of the contacts and the metal interconnections, and their layout sizes are the same as well. Therefore, in the latter half of the chip layout designing for a packaged device, it is possible to easily make a modification by switching from the circuit in the second embodiment to the circuit in the fourth embodiment, or vise versa. For example, if access time of the SRAM is sufficiently short when an actual load is verified, it is desirable to adopt the circuit in the embodiment of the present invention so as to reduce leakage current. On the other hand, if access time of the SRAM is long, it is desirable to adopt the circuit in the second embodiment so as to avoid a timing error.

(Characteristics of the Layout of Memory Cells in the Embodiment of the Present Invention)

Description will hereinafter be made on characteristics of the layout of memory cells in the embodiment of the present invention.

(1) The layout of memory cells becomes longer in a horizontal direction, so that the length of the bit lines can be reduced. Therefore, data readout from the memory cells and data write to the memory cells can be performed at a high speed and with low power.

(2) The gates of all of the transistors in the memory cells are oriented in the same direction, and transistors N23, P20, N20, N24, P22 are aligned, and transistors N21, P21, N22, N25, P23 are aligned. Therefore, lithography becomes easy and manufacturing variations can be prevented.

(3) The memory cells adjacent to each other in the column direction share the pair of read word lines RWL, /RWL. Moreover, in the memory cells adjacent to each other in the column direction, the memory cells in an even-numbered row are connected to first read bit line RBLA, and the memory cells in an odd-numbered row are connected to second read bit line RBLB. The number of the interconnections extending in the word line direction (the X-axis direction, the direction of the rows) can thereby be reduced, and the length in the bit line direction (the Y-axis direction, the direction of the columns) can be reduced. Further, if the length in the bit line direction is set to be constant, the pitch of the interconnections can be increased, which makes it possible to reduce a coupling noise between the word lines.

(4) Between write bit line WBL or /WBL and first read bit line RBLA or second read bit line RBLB, at least ground line VSS is placed in the same interconnection layer, so that a shield is formed therebetween and a coupling noise can be reduced.

(5) Between first read bit line RBLA and second read bit line RBLB, power supply line VDD is placed in the same interconnection layer, so that a shield is formed therebetween and a coupling noise can be reduced.

(6) The read buffer circuit is configured with a tristate inverter, so that it is possible to achieve a large effect of reducing leakage current.

Fifth Embodiment

An embodiment of the present invention relates to a modification of the exemplary packaging of memory cells (the upper and lower layers) in the fourth embodiment.

(Exemplary Packaging of Memory Cells: Lower Layer)

Figure 14:
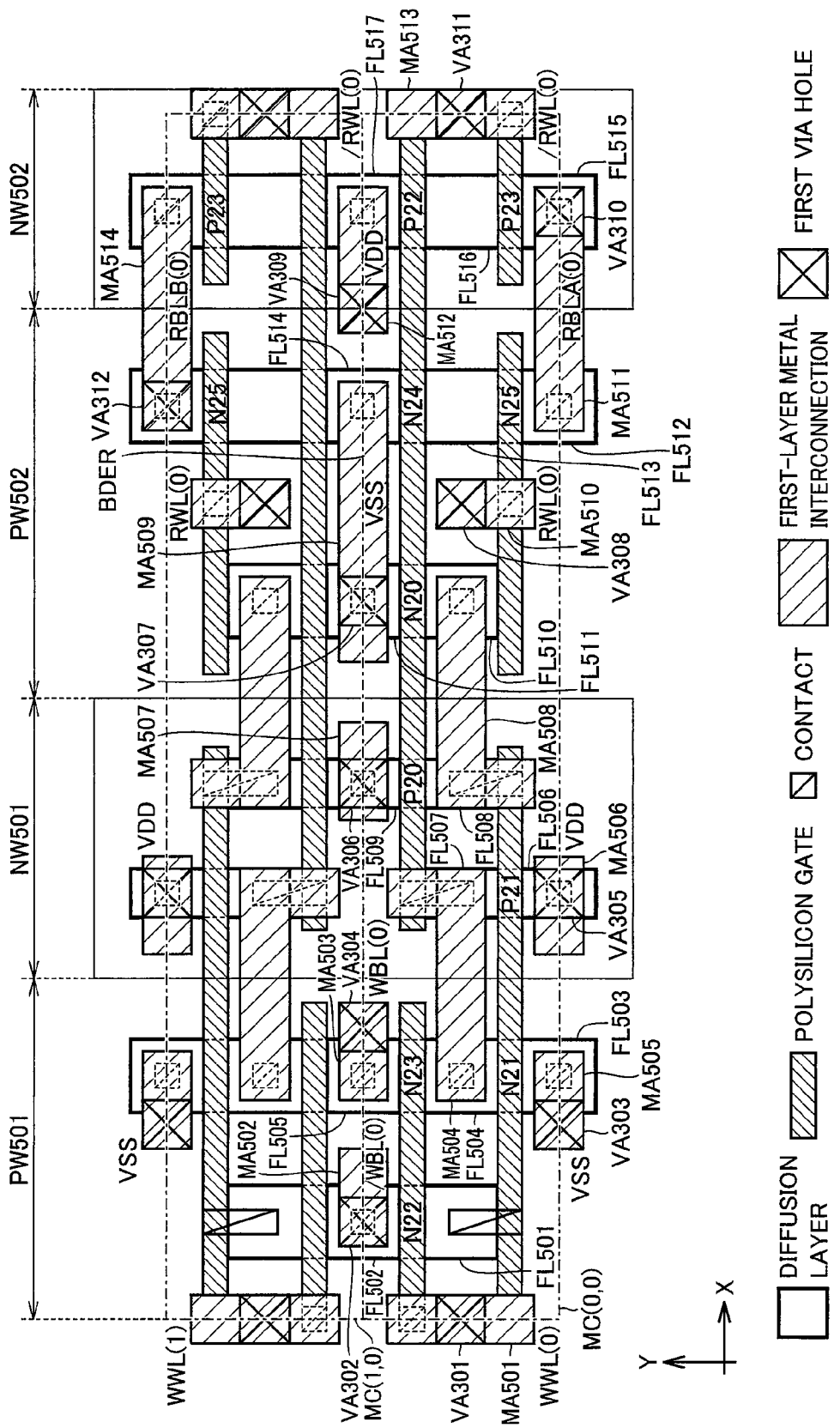
FIG. 14 is a plan view that shows an arrangement of a lower layer including a well, a diffusion region, a polysilicon, a contact hole, a first-layer metal interconnection, and a first via hole of a memory cell array in a fifth embodiment.

FIG. 14 is a plan view that shows an arrangement of the lower layer including a well, a diffusion region, a polysilicon, a contact hole, a first-layer metal interconnection, and a first via hole of a memory cell array in a fifth embodiment.

The arrangement in FIG. 14 differs from the arrangement in the third embodiment in FIG. 9 on the following points.

In other words, in the third embodiment in FIG. 9, contact hole CT is arranged in N-type diffusion region FL313 that configures N-channel MOS transistors N14, N15, and contact hole CT is arranged in P-type diffusion region FL316 that configures P-channel MOS transistors P12, P13, and these contact holes CT are electrically connected via first-layer metal interconnection MA311. Therefore, in the third embodiment, P-channel MOS transistor P13 is connected to N-channel MOS transistor N14, and P-channel MOS transistor P12 is connected to N-channel MOS transistor N15.

In contrast, in the fifth embodiment in FIG. 14, contact hole CT is not arranged in an N-type diffusion region FL513 that configures N-channel MOS transistors N24, N25, and contact hole CT is not arranged in a P-type diffusion region FL516 that configures P-channel MOS transistors P22, P23. Since no contact hole CT exists, there exists no first-layer metal interconnection for connecting contact holes. As a result, in the fifth embodiment, P-channel MOS transistor P23 is not connected to N-channel MOS transistor N24, and P-channel MOS transistor P22 is not connected to N-channel MOS transistor N25.

(Exemplary Packaging of Memory Cells: Upper Layer)

Figure 15:
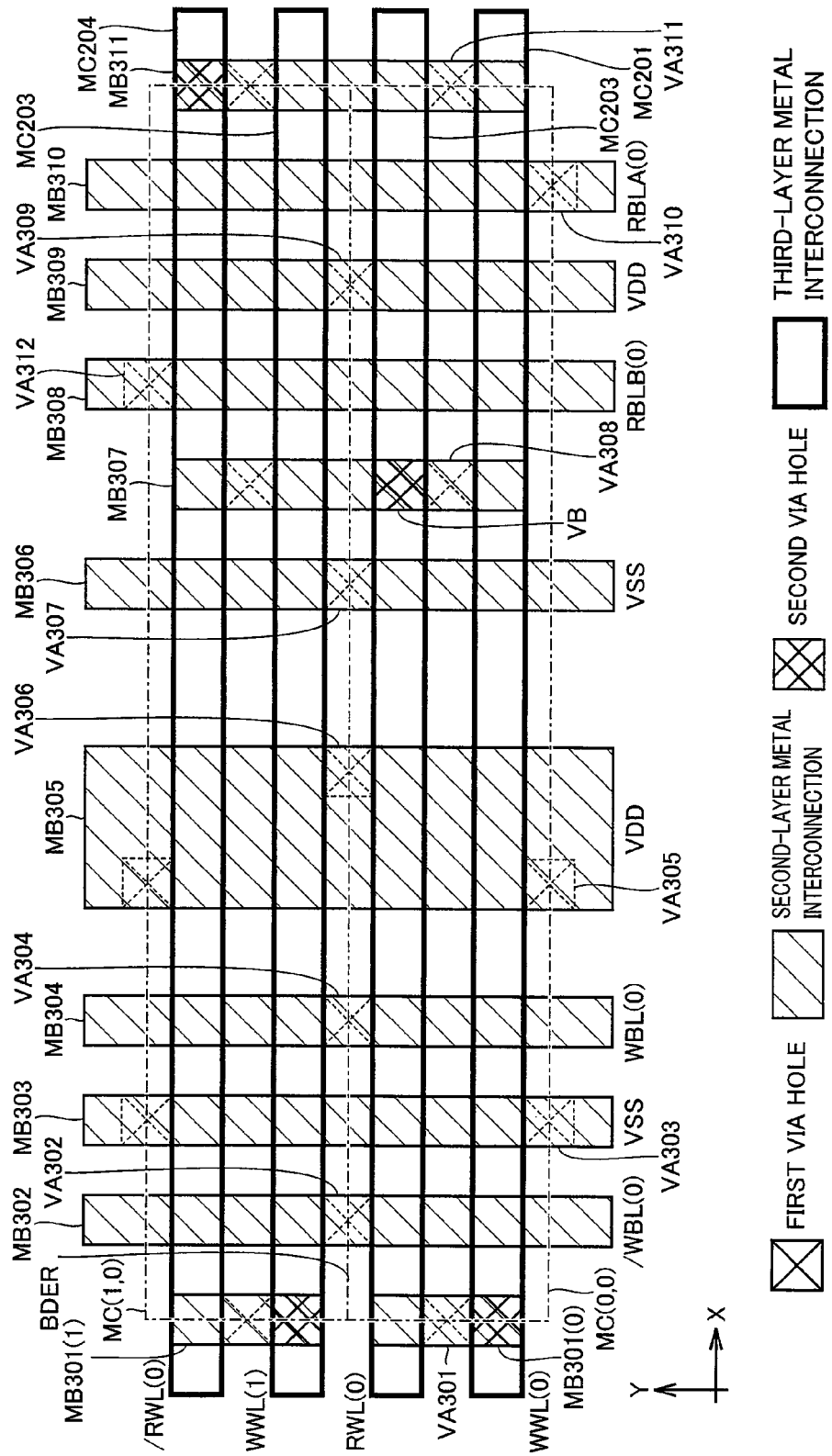
FIG. 15 is a plan view that shows an arrangement of an upper layer including a first via hole, a second-layer metal interconnection, a second via hole, and a third-layer metal interconnection in the fifth embodiment.

FIG. 15 is a plan view that shows an arrangement of the upper layer including a first via hole, a second-layer metal interconnection, a second via hole, and a third-layer metal interconnection in the fifth embodiment.

The arrangement of the upper layer in the fifth embodiment is similar to the arrangement of the upper layer in the third embodiment shown in FIG. 10, and thus the description thereof will not be repeated.

(Characteristics of the Layout of Memory Cells in the Embodiment of the Present Invention)

Description will hereinafter be made on characteristics of the layout of memory cells in the embodiment of the present invention.

Like the fourth embodiment, the embodiment of the present invention has characteristics (1), (3), (5), and (6) as described in the fourth embodiment. Further, the embodiment of the present invention has the following characteristics.

(2)' The gates of all of the transistors in the memory cells are oriented in the same direction, and transistors N22, N23, P20, N20, M24, P22 are aligned, and transistors N21, P21, N25, P23 are aligned. Therefore, lithography becomes easy and manufacturing variations can be prevented.

(4)' Between write bit line WBL or /WBL and first read bit line RBLA or second read bit line RBLB, power supply line VDD and ground line VSS are placed in the same interconnection layer, so that a shield is formed therebetween and a coupling noise can be reduced.

REFERENCE

For comparison with the second embodiment, description will be given on the case (a reference example) in which the memory cells adjacent in the Y direction do not share the pair of read word lines RWL, /RWL.

Figure 16:
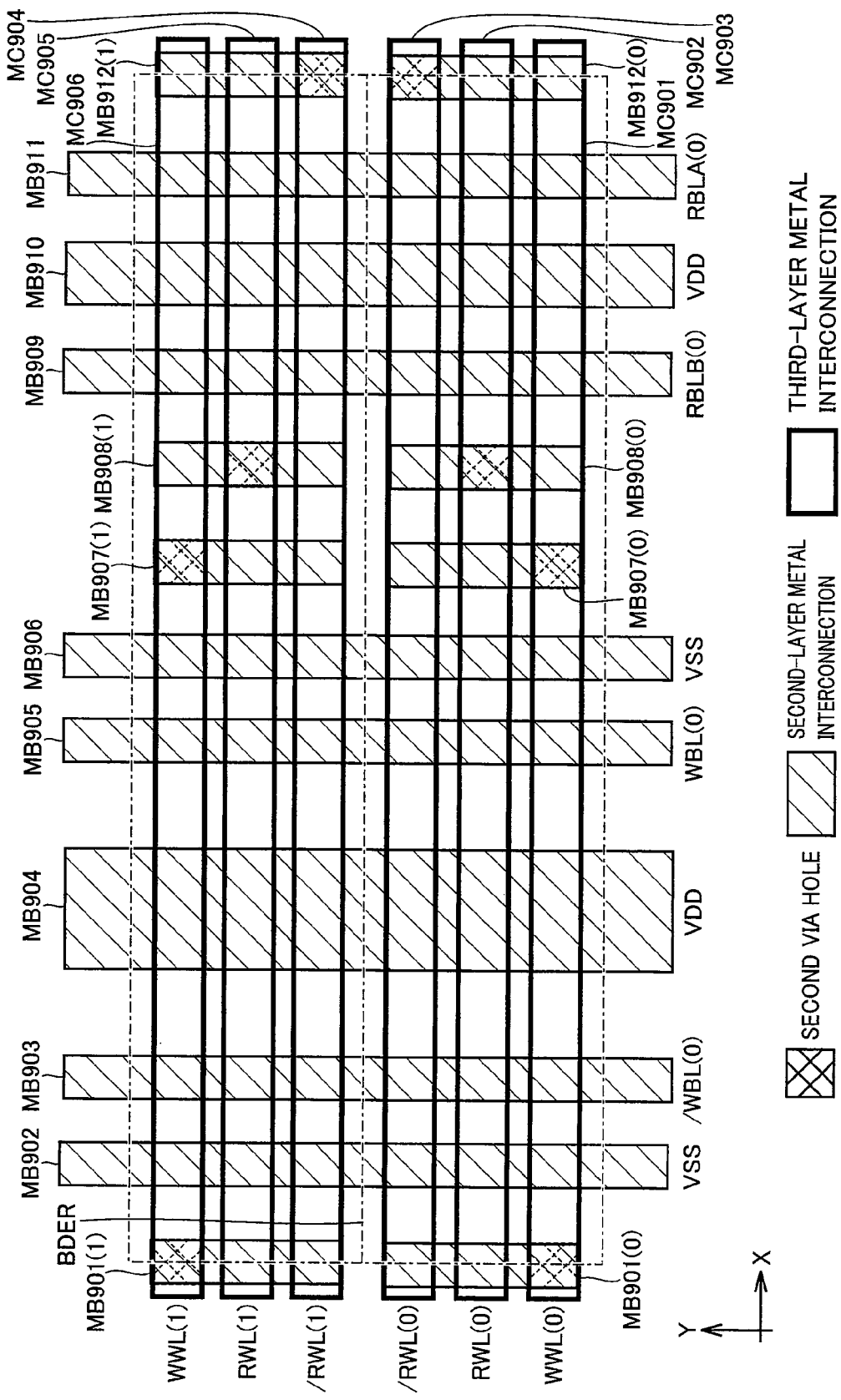
FIG. 16 is a plan view that shows an arrangement of an upper layer including a first via hole, a second-layer metal interconnection, a second via hole, and a third-layer metal interconnection in a reference example.

FIG. 16 is a plan view that shows an arrangement of the upper layer including a first via hole, a second-layer metal interconnection, a second via hole, and a third-layer metal interconnection in the reference example.

With reference to FIG. 16, in this example as well, an arrangement of the transistors is similar to the arrangement in the second embodiment in FIG. 8. However, it is necessary to place three word lines (WWL, RWL, /RWL) for each row. As a result, in the reference example, it is not possible to achieve the effect of reducing a length in the bit line direction (the Y-axis direction, the direction of the columns) or the effect of increasing the pitch of the interconnections so that a coupling noise between the word lines can be reduced, when the length in the bit line direction is set to be constant, as described in the second embodiment.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor memory device, comprising:
    a memory cell array having a plurality of memory cells arranged in rows and columns;
    first and second read word lines arranged corresponding to each of sets, each set composed of a pair of adjacent ones of the rows; and
    first, second, third, and fourth read bit lines provided in each of the columns, wherein
    each of said first and second read word lines is connected to first and second memory cells in a corresponding one of the sets, the first and second memory cells are arranged adjacently to each other in one column, and
    each of said first and third read bit lines is connected to the first memory cell in a corresponding one of the columns, and each of said second and fourth read bit lines is connected to the second memory cell in the corresponding one of the columns.

2. The semiconductor memory device according to claim 1, further comprising
    a first read row decoder controlling activation of said first read word line based on a set-specifying address in a first read address,
    a second read row decoder controlling activation of said second read word line based on a set-specifying address in a second read address,
    a first selector which is provided in each of the columns, and to which said first read bit line and said second read bit line are connected,
    a second selector which is provided in each of the columns, and to which said third read bit line and said fourth read bit line are connected,
    a first read column decoder providing control as to an output signal of which first selector out of the first selectors in all of the columns should be selected, based on a column-specifying address in said first read address, and
    a second read column decoder providing control as to an output signal of which second selector out of the second selectors in all of the columns should be selected, based on a column-specifying address in said second read address, wherein
    said first selector selects and outputs a signal of any of said first read bit line and said second read bit line, based on a row-in-set-specifying address in said first read address, and
    said second selector selects and outputs a signal of any of said third read bit line and said fourth read bit line, based on a row-in-set-specifying address in said second read address.

3. The semiconductor memory device according to claim 2, further comprising a precharge circuit precharging said first, second, third, and fourth read bit lines prior to data readout from said memory cells.

4. The semiconductor memory device according to claim 3, further comprising
    a write word line provided in each of the rows, and
    a pair of a write bit line of a positive phase and a write bit line of a negative phase, provided in each of the columns, wherein
    each of said write word lines is connected to memory cells in a corresponding one of the rows, and
    each of said pairs of the write bit lines is connected to memory cells in a corresponding one of the columns.

5. The semiconductor memory device according to claim 4, wherein
    each of said memory cells includes
    a first CMOS inverter made of a first MOS transistor of a first conductivity type and a second MOS transistor of a second conductivity type,
    a second CMOS inverter made of a third MOS transistor of the first conductivity type and a fourth MOS transistor of the second conductivity type,
    said first CMOS inverter having an input terminal which is identified as a first storage terminal connected to an output terminal of said second CMOS inverter, said second CMOS inverter having an input terminal which is identified as a second storage terminal connected to an output terminal of said first CMOS inverter, a fifth MOS transistor of the second conductivity type, connected between said write bit line of the negative phase and said second storage terminal, and having a control electrode to which said write word line is connected, a sixth MOS transistor of the second conductivity type, connected between said write bit line of the positive phase and said first storage terminal, and having a control electrode to which said write word line is connected, a seventh MOS transistor of the second conductivity type and an eighth MOS transistor of the second conductivity type, connected in series between a ground node and one of said first read bit line and said second read bit line, and a ninth MOS transistor of the second conductivity type and a tenth MOS transistor of the second conductivity type, connected in series between the ground node and one of said third read bit line and said fourth read bit line, wherein a control electrode of said seventh MOS transistor is connected to said first read word line, a control electrode of said ninth MOS transistor is connected to said second read word line, and a control electrode of said eighth MOS transistor and a control electrode of said tenth MOS transistor are connected to said second storage terminal.

6. The semiconductor memory device according to claim 5, wherein said semiconductor memory device includes a first-layer metal interconnection connected to any of said first, second, third, fourth, fifth, sixth, seventh, eighth, ninth, and tenth MOS transistors via a contact hole, said pair of the write bit lines is placed in a direction of the columns with use of a second-layer metal interconnection serving as an upper layer with respect to said first-layer metal interconnection, and said first, second, third, and fourth read bit lines are placed in the direction of the columns with use of said second-layer metal interconnection.

7. The semiconductor memory device according to claim 6, wherein in each of the columns, said first, second, third, and fourth read bit lines corresponding to said each of the columns are placed in the direction of the columns, and in each of the columns, said pair of the write bit lines corresponding to said each of the columns is placed in the direction of the columns.

8. The semiconductor memory device according to claim 7, further comprising a power supply line and a ground line, placed in the direction of the columns with use of said second-layer metal interconnection, wherein said ground line, or said ground line and said power supply line is/are arranged between any of the write bit lines in said pair and any of said first, second, third, and fourth read bit lines.

9. The semiconductor memory device according to claim 6, wherein said write word line is placed in a direction of the rows with use of a third-layer metal interconnection serving as an upper layer with respect to said second-layer metal interconnection, and said first and second read word lines are placed in the direction of the rows with use of said third-layer metal interconnection.

10. The semiconductor memory device according to claim 9, wherein in each of the rows, said write word line corresponding to said each of the rows is placed in the direction of the rows, and in one row in each of the sets, said first read word line corresponding to said each of the sets is placed in the direction of the rows, and in the other row in each of the sets, said second read word line corresponding to said each of the sets is placed in the direction of the rows.

11. A semiconductor memory device, comprising:

a memory cell array having a plurality of memory cells arranged in rows and columns;

a pair of a read word line of a positive phase and a read word line of a negative phase arranged corresponding to each sets, each set composed of a pair of adjacent ones of the rows; and a first read bit line and a second read bit line, provided in each of the columns, wherein each of said pairs of the read word lines is connected to first and second memory cells in a corresponding one of the sets, the first and second memory cells are arranged adjacently to each other in one column, and said first read bit line is connected to the first memory cell in a corresponding one of the columns, and said second read bit line is connected to the second memory cell in the corresponding one of the columns.

12. The semiconductor memory device according to claim 11, further comprising a read row decoder controlling activation of said pair of the read word lines based on a set-specifying address in a read address, a selector which is provided in each of the columns, and to which said first read bit line and said second read bit line are connected, and a read column decoder providing control as to an output signal of which selector out of the selectors in all of the columns should be selected, based on a column-specifying address in the read address, wherein said selector selects and outputs a signal of any of said first read bit line and said second read bit line, based on a row-in-set-specifying address in said read address.

13. The semiconductor memory device according to claim 12, further comprising a write word line provided in each of the rows, and a pair of a write bit line of a positive phase and a write bit line of a negative phase, provided in each of the columns, wherein each of said write word lines is connected to memory cells in a corresponding one of the rows, and each of said pairs of the write bit lines is connected to memory cells in a corresponding one of the columns.

14. The semiconductor memory device according to claim 13, wherein each of said memory cells includes a first CMOS inverter made of a first MOS transistor of a first conductivity type and a second MOS transistor of a second conductivity type, a second CMOS inverter made of a third MOS transistor of the first conductivity type and a fourth MOS transistor of the second conductivity type, said first CMOS inverter having an input terminal which is identified as a first storage terminal connected to an output terminal of said second CMOS inverter, said second CMOS inverter having an input terminal which is identified as a second storage terminal connected to an output terminal of said first CMOS inverter, a fifth MOS transistor of the second conductivity type, connected between said write bit line of the negative phase and said second storage terminal, and having a control electrode to which said write word line is connected, a sixth MOS transistor of the second conductivity type, connected between said write bit line of the positive phase and said first storage terminal, and having a control electrode to which said write word line is connected, a third CMOS inverter made of a seventh MOS transistor of the first conductivity type and an eighth MOS transistor of the second conductivity type, and a transfer gate made of a ninth MOS transistor of the first conductivity type and a tenth MOS transistor of the second conductivity type, wherein an output terminal of said third CMOS inverter is connected to said second storage terminal, and said transfer gate is connected between an input of said third CMOS inverter and one of said first read bit line and said second read bit line, and has one control electrode to which the read word line of the positive phase is connected, and has the other control electrode to which the read word line of the negative phase is connected.

15. The semiconductor memory device according to claim 14, wherein said semiconductor memory device includes a first-layer metal interconnection connected to any of said first, second, third, fourth, fifth, sixth, seventh, eighth, ninth, and tenth MOS transistors via a contact hole, said pair of the write bit lines is placed in a direction of the columns with use of a second-layer metal interconnection serving as an upper layer with respect to said first-layer metal interconnection, and said first and second read bit lines are placed in the direction of the columns with use of said second-layer metal interconnection.

16. The semiconductor memory device according to claim 13, wherein each of said memory cells includes a first CMOS inverter made of a first MOS transistor of a first conductivity type and a second MOS transistor of a second conductivity type, a second CMOS inverter made of a third MOS transistor of the first conductivity type and a fourth MOS transistor of the second conductivity type, said first CMOS inverter having an input terminal which is identified as a first storage terminal connected to an output terminal of said second CMOS inverter, said second CMOS inverter having an input terminal which is identified as a second storage terminal connected to an output terminal of said first CMOS inverter, a fifth MOS transistor of the second conductivity type, connected between said write bit line of the negative phase and said second storage terminal, and having a control electrode to which said write word line is connected, a sixth MOS transistor of the second conductivity type, connected between said write bit line of the positive phase and said first storage terminal, and having a control electrode to which said write word line is connected, and a tristate inverter made of a seventh MOS transistor of the first conductivity type, an eighth MOS transistor of the first conductivity type, a ninth MOS transistor of the second conductivity type, and a tenth MOS transistor of the second conductivity type, all connected in series between a power supply node and a ground node, wherein an input of said tristate inverter is connected to one of said first read bit line and said second read bit line, an output of said tristate inverter is connected to said second storage terminal, a control electrode of said eighth MOS transistor is connected to said read word line of the negative phase, and a control electrode of said ninth MOS transistor is connected to said read word line of the positive phase.

17. The semiconductor memory device according to claim 16, wherein said semiconductor memory device includes a first-layer metal interconnection connected to any of said first, second, third, fourth, fifth, sixth, seventh, eighth, ninth, and tenth MOS transistors via a contact hole, said pair of the write bit lines is placed in a direction of the columns with use of a second-layer metal interconnection serving as an upper layer with respect to said first-layer metal interconnection, and said first and second read bit lines are placed in the direction of the columns with use of said second-layer metal interconnection.

18. The semiconductor memory device according to claim 17, wherein in each of the columns, said first and second read bit lines corresponding to said each of the columns are placed in the direction of the columns, and in each of the columns, said pair of the write bit lines corresponding to said each of the columns is placed in the direction of the columns.

19. The semiconductor memory device according to claim 18, further comprising a power supply line and a ground line, placed in the direction of the columns with use of said second-layer metal interconnection, wherein said power supply line and said ground line are arranged between any of the write bit lines in said pair and any of said first and second read bit lines.

20. The semiconductor memory device according to claim 18, further comprising a power supply line placed in the direction of the columns with use of said second-layer metal interconnection, wherein said power supply line is arranged between said first read bit line and said second read bit line.

21. The semiconductor memory device according to claim 17, wherein said write word line is placed in the direction of the rows with use of a third-layer metal interconnection serving as an upper layer with respect to said second-layer metal interconnection, and said pair of the read word lines is placed in the direction of the rows with use of said third-layer metal interconnection.

22. The semiconductor memory device according to claim 21, wherein in each of the rows, said write word line corresponding to said each of the rows is placed in the direction of the rows, and in one row in each of the sets, said read word line of the positive phase corresponding to said each of the sets is placed in the direction of the rows, and in the other row in each of the sets, said read word line of the negative phase corresponding to said each of the sets is placed in the direction of the rows.

* * * * *